(12) United States Patent
Lee et al.

(10) Patent No.: US 11,985,868 B2
(45) Date of Patent: *May 14, 2024

(54) DISPLAY APPARATUS

(71) Applicant: SAMSUNG DISPLAY CO., LTD., Yongin-si (KR)

(72) Inventors: Changho Lee, Yongin-si (KR); Taeyong Eom, Yongin-si (KR); Dongjin Moon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/186,929

(22) Filed: Mar. 20, 2023

(65) Prior Publication Data

US 2023/0232674 A1  Jul. 20, 2023

Related U.S. Application Data

(63) Continuation of application No. 17/447,262, filed on Sep. 9, 2021, now Pat. No. 11,610,958.

(30) Foreign Application Priority Data

Sep. 22, 2020  (KR) .................... 10-2020-0122435

(51) Int. Cl.
*H10K 59/126* (2023.01)
*G06F 3/044* (2006.01)
(Continued)

(52) U.S. Cl.
CPC ......... *H10K 59/126* (2023.02); *G06F 3/0446* (2019.05); *H10K 50/844* (2023.02); *H10K 59/40* (2023.02); *H10K 59/65* (2023.02)

(58) Field of Classification Search
CPC ...... H10K 59/126; H10K 59/40; H10K 59/65; H10K 50/844; G06F 3/0446
(Continued)

(56) References Cited

U.S. PATENT DOCUMENTS 8,101,857 B2  1/2012  Kido et al.
9,599,862 B2  3/2017  Park et al.
(Continued)

FOREIGN PATENT DOCUMENTS

KR  10-2017-0111827 A  10/2017
KR  10-2018-0063633 A  6/2018
(Continued)

*Primary Examiner* — Prabodh M Dharia
(74) *Attorney, Agent, or Firm* — Lewis Roca Rothgerber Christie LLP

(57) ABSTRACT

A display apparatus includes: a substrate including a first area, a second area surrounding the first area and spaced apart from the first area, and a third area between the first area and the second area; a plurality of pixel circuits on the substrate at the second area, each of the plurality of pixel circuits including one or more thin-film transistors, and a storage capacitor; a plurality of lines on the substrate at the third area, and electrically connected to the pixel circuits, respectively; an encapsulation member covering the pixel circuits; an input sensing section on the encapsulation member to overlap with the second area, and including sensing electrodes, and trace lines electrically connected to the sensing electrodes; and a plurality of shielding portions on the encapsulation member to overlap with at least one of the plurality of lines, the plurality of shielding portions being spaced apart from each other.

18 Claims, 27 Drawing Sheets

(51) Int. Cl.
   *H10K 50/844* (2023.01)
   *H10K 59/40* (2023.01)
   *H10K 59/65* (2023.01)

(58) Field of Classification Search
   USPC ........................................................ 345/174
   See application file for complete search history.

(56) References Cited

U.S. PATENT DOCUMENTS

| | | |
|---|---|---|
| 9,601,722 B2 | 3/2017 | Lee et al. |
| 10,466,822 B2 | 11/2019 | Kim et al. |
| 2017/0170242 A1* | 6/2017 | Choi ...................... H10K 59/40 |
| 2017/0287992 A1 | 10/2017 | Kwak et al. |
| 2017/0364194 A1 | 12/2017 | Jang et al. |
| 2018/0129352 A1* | 5/2018 | Kim ...................... G06F 3/0446 |
| 2019/0014402 A1* | 1/2019 | Ahn ................... H05K 7/20963 |
| 2019/0081118 A1 | 3/2019 | Oh et al. |
| 2019/0237533 A1* | 8/2019 | Kim ....................... H10K 59/40 |
| 2019/0245159 A1 | 8/2019 | Kim et al. |
| 2020/0104563 A1 | 4/2020 | Ryu et al. |
| 2020/0159369 A1 | 5/2020 | Seo et al. |
| 2020/0175900 A1 | 6/2020 | Han et al. |
| 2020/0192148 A1 | 6/2020 | Kim et al. |
| 2020/0243610 A1 | 7/2020 | Han et al. |
| 2022/0123073 A1 | 4/2022 | Li et al. |

FOREIGN PATENT DOCUMENTS

| | | |
|---|---|---|
| KR | 10-2020-0042071 A | 4/2020 |
| KR | 10-2020-0057896 A | 5/2020 |
| KR | 10-2020-0075547 A | 6/2020 |

\* cited by examiner

DISPLAY APPARATUS

CROSS-REFERENCE TO RELATED APPLICATIONS

This application is a continuation of U.S. patent application Ser. No. 17/447,262, filed Sep. 9, 2021, which claims priority to and the benefit of Korean Patent Application No. 10-2020-0122435, filed Sep. 22, 2020, the entire content of both of which is incorporated herein by reference.

BACKGROUND

1. Field

Aspects of one or more embodiments of the present disclosure relate to a display apparatus.

2. Description of Related Art

A display apparatus visually displays data. A display panel of the display apparatus displays an image. A plurality of pixels are formed in a display area of the display panel. In the display panel, a scan line and a data line are insulated from each other, and a pixel circuit including a thin-film transistor and a storage capacitor corresponding to each of the plurality of pixels may be provided. Various lines for transmitting electrical signals to the pixel circuits in the display area, a scan driver, a data driver, a controller, or the like may be provided in a peripheral area of the display panel. The peripheral area may be a non-display area where no image is displayed.

The usage of display apparatuses has been steadily diversified and expanded as the display apparatuses have become thinner and lighter.

As the area occupied by the display area in the display apparatus has been expanded, various functions combined with or linked to the display apparatus have been added to the display apparatus. As a way to add various functions to the display apparatus, a display apparatus having an area for adding various functions other than displaying an image in the display area has been studied.

The above information disclosed in this Background section is for enhancement of understanding of the background of the present disclosure, and therefore, it may contain information that does not constitute prior art.

SUMMARY

A display apparatus may include a transmission area through which light may be transmitted, and various lines electrically connected to a pixel circuit of the display area may bypass the transmission area. The transmission area may be an area for adding various functions to the display area of the display apparatus. However, the lines around the transmission area may be visually recognized by a user.

One or more embodiments of the present disclosure are directed to a high-quality display apparatus in which visibility of the lines around the transmission area may be reduced or minimized. However, the aspects and features of the present disclosure are not limited thereto.

Additional aspects and features will be set forth, in part, in the description which follows, and, in part, will be apparent from the description, or may be learned by practicing one or more of the presented embodiments of the present disclosure.

According to one or more embodiments of the present disclosure, a display apparatus includes: a substrate including a first area, a second area surrounding the first area and spaced apart from the first area, and a third area between the first area and the second area; a plurality of pixel circuits on the substrate at the second area, each of the plurality of pixel circuits including one or more thin-film transistors, and a storage capacitor; a plurality of lines on the substrate at the third area, and electrically connected to the pixel circuits, respectively; an encapsulation member covering the pixel circuits; an input sensing section on the encapsulation member to overlap with the second area, and including sensing electrodes, and trace lines electrically connected to the sensing electrodes; and a plurality of shielding portions on the encapsulation member to overlap with at least one of the plurality of lines, the plurality of shielding portions being spaced apart from each other.

In an embodiment, each of the plurality of shielding portions may include a conductive material.

In an embodiment, each of the plurality of shielding portions may include molybdenum (Mo), mendelevium (Mb), silver (Ag), titanium (Ti), copper (Cu), aluminum (Al), or an alloy thereof.

In an embodiment, the plurality of shielding portions may include the same material as that of the trace lines of the input sensing section.

In an embodiment, the plurality of shielding portions may be electrically isolated.

In an embodiment, the display apparatus may further include a first metal wire located outside of the plurality of shielding portions.

In an embodiment, the first metal wire may be electrically connected to one of the sensing electrodes of the input sensing section.

In an embodiment, the display apparatus may further include a second metal wire between the plurality of shielding portions and the first metal wire in a plan view, and the second metal wire may be electrically isolated.

In an embodiment, each of the first metal wire and the second metal wire may include the same material as that of the trace lines of the input sensing section.

In an embodiment, the display apparatus may further include: a first conductive layer including at least some of the trace lines of the input sensing section; a second conductive layer including the sensing electrodes of the input sensing section; and an insulating layer between the first conductive layer and the second conductive layer.

In an embodiment, the insulating layer may extend from the second area to the third area, and may have a hole corresponding to the first area.

In an embodiment, a portion of the insulating layer may be between two adjacent shielding portions from among the plurality of shielding portions.

In an embodiment, each of the plurality of shielding portions may surround the first area, and may be located along an outer direction away from the first area.

In an embodiment, each of the plurality of shielding portions may have a closed curve shape.

In an embodiment, widths of the plurality of shielding portions may be the same as each other.

In an embodiment, widths of at least two of the plurality of shielding portions may be different from each other.

In an embodiment, the plurality of shielding portions may include first, second, and third shielding portions that are sequentially located along the outer direction, and have first, second, and third widths, respectively, and the first width may be less than the second width, and the second width may be less than the third width.

In an embodiment, the plurality of shielding portions may include first, second, and third shielding portions that are sequentially located along the outer direction, and have first, second, and third widths, respectively, and the first width may be greater than the second width, and the second width may be greater than the third width.

In an embodiment, a first interval between the first shielding portion and the second shielding portion may be the same as a second interval between the second shielding portion and the third shielding portion.

In an embodiment, a first interval between the first shielding portion and the second shielding portion may be different from a second interval between the second shielding portion and the third shielding portion.

In an embodiment, each of the plurality of shielding portions may include an outer edge facing the outer direction, and an inner edge opposite to the outer edge facing the first area, and at least one edge from among the outer edge and the inner edge may include a plurality of protruding portions.

In an embodiment, the plurality of protruding portions may be located at equal intervals along the at least one edge.

In an embodiment, the plurality of protruding portions may be located at irregular intervals along the at least one edge.

In an embodiment, each of the protruding portions may have a shape including a polygon portion, a circle portion, or an ellipse portion in a plan view.

In an embodiment, the plurality of shielding portions may have the same width as each other, and may be located at equal intervals from each other, to have a constant pitch, and a ratio of the width to the pitch may be about 0.1 to about 0.9.

Other aspects and features of the present disclosure will become more apparent from the detailed description, the drawings, and the claims and their equivalents.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
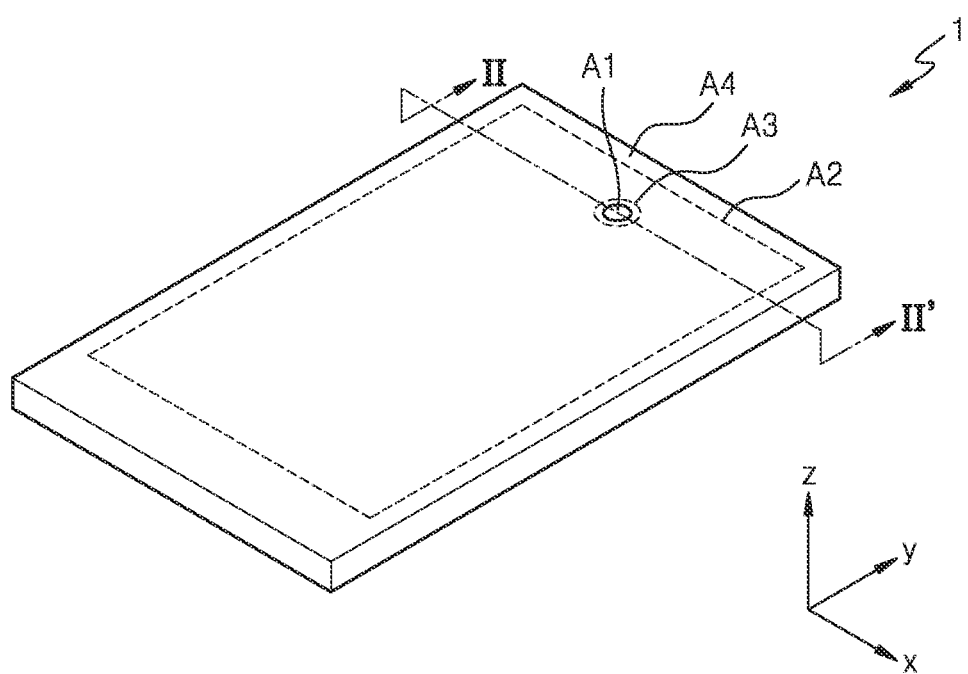
FIG. 1 is a perspective view schematically illustrating a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When an embodiment may be implemented differently, a specific process order may be performed differently from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the following, the x-axis, the y-axis, and the z-axis are not limited to the three axes of a rectangular coordinate system, and may be interpreted in a broader sense. For example, the x-axis, the y-axis, and the z-axis may be perpendicular to or substantially perpendicular to one another, or may represent different directions that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof. Similarly, the expression "at least one of A and B" is used herein to indicate a selection of only A, a selection of only B, or a selection of both A and B.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view schematically illustrating a display apparatus 1 according to an embodiment.

Referring to FIG. 1, the display apparatus 1 may include a first area A1, and a second area A2 surrounding (e.g., around a periphery of) the first area A1 and spaced apart from the first area A1. A plurality of pixels, for example, such as an array of pixels, may be arranged at (e.g., in or on) the second area A2. The second area A2 may display an image using light emitted by the array of pixels. The first area A1 may be entirely surrounded (e.g., around a periphery thereof) by the second area A2. The first area A1 may be an area at (e.g., in or on) which one or more components capable of providing various suitable functions to the display apparatus 1 are arranged. For example, when the component includes a sensor or a camera that uses light, the first area A1 corresponds to a transmission area through which light from the sensor or light traveling to the camera may pass.

A third area A3 may be provided between the first area A1 and the second area A2. The third area A3 may be a kind of non-display area at (e.g., in or on) which no pixels are arranged. A fourth area A4 may at least partially surround (e.g., around a periphery of) the second area A2, and like the third area A3, may be a kind of non-display area at (e.g., in or on) which no pixels are arranged. Various suitable kinds of lines, wirings, circuits, and the like may be arranged at (e.g., in or on) the fourth area A4.

Hereinbelow, for convenience, the display apparatus 1 including an organic light-emitting display panel is described in more detail as an example of the display apparatus 1 according to an embodiment, but the present disclosure is not limited thereto. In other embodiments, the display apparatus 1 of the present disclosure may include any suitable kind of display panel, for example, such as an inorganic light-emitting display panel or a quantum dot light-emitting display panel.

FIG. 1 shows that the first area A1 is arranged at the center of the second area A2 in a horizontal direction (e.g., the ±x direction) of the display apparatus 1, but the present disclosure is not limited thereto. For example, in another embodiment, the first area A1 may be offset to the left side or the right side of the display apparatus 1 in the horizontal direction. In addition or alternatively, the first area A1 may be arranged at (e.g., in or on) various positions, such as at an upper side, a center, or a lower side of the display apparatus 1 in a vertical direction (e.g., the ±y direction).

FIG. 1 shows that the display apparatus 1 includes one first area A1, but the present disclosure is not limited thereto, and in other embodiments, the display apparatus 1 may include a plurality of first areas A1. When the plurality of first areas A1 are provided, a plurality of components corresponding to the plurality of first areas A1, respectively, may be provided.

The display apparatus 1 may be used in a portable electronic device, for example, such as mobile phones, smart phones, tablet personal computers (PCs), mobile communication terminals, electronic notebooks, electronic books, portable multimedia players (PMPs), navigation systems, ultra-mobile PCs (UMPCs), and/or the like, as well as a display screen of various suitable products, for example, such as televisions, laptop computers, monitors, billboards, Internet of things (IoT) devices, and/or the like. In addition, the display apparatus 1 according to an embodiment may be used in a wearable device, for example, such as smart watches, watch phones, glasses-type displays, head-mounted displays (HMDs), and/or the like. In addition, the display apparatus 1 according to an embodiment may be used in an instrument panel of a vehicle, a center information display (CID) on a center fascia of a vehicle or a dashboard, a room mirror display replacing a side-view mirror of a vehicle, a display screen on the rear surface of the front seat for rear-seat entertainment for a vehicle, and/or the like.

Figure 2:
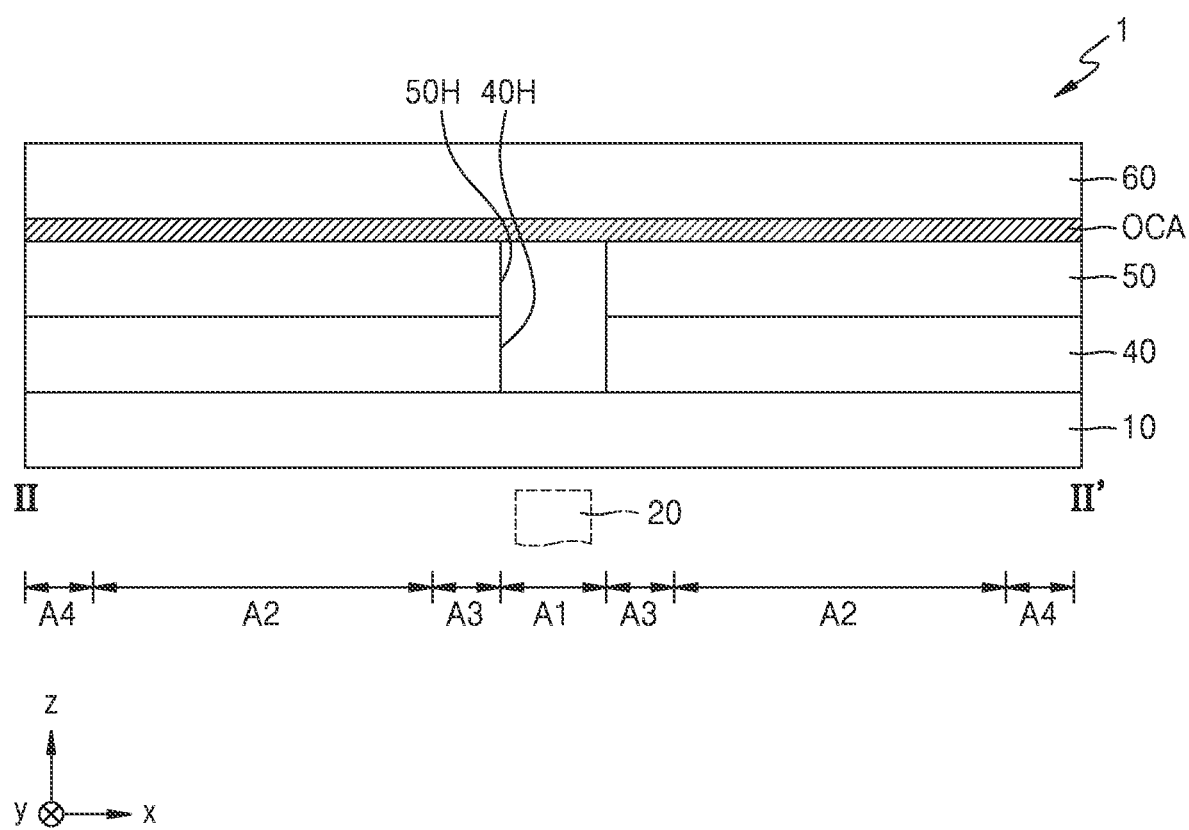
FIG. 2 is a schematic cross-sectional view of a display apparatus according to an embodiment.

FIG. 2 is a schematic cross-sectional view of the display apparatus 1 according to an embodiment.

Referring to FIG. 2, the display apparatus 1 may include a display panel 10, an input sensing section (e.g., an input sensing layer) 40 arranged on the display panel 10, an optical functional section (e.g., an optical functional layer) 50, and a window 60 covering the above elements. The window 60 may be bonded to (e.g., may be attached to) the elements therebelow, for example, such as to the optical functional section 50, through an adhesive layer, for example, such as an optical clear adhesive (OCA).

The display panel 10 may include a plurality of light-emitting elements arranged at (e.g., in or on) the second area A2, and pixel circuits electrically connected to the plurality of light-emitting elements, respectively. The input sensing section 40 may obtain coordinate information according to an external input, for example, such as a touch event. The input sensing section 40 may include a sensing electrode (or a touch electrode), and trace lines connected to the sensing electrode. The input sensing section 40 may be arranged on the display panel 10. The input sensing section 40 may detect an external input using a mutual capacitance method or a self-capacitance method.

The input sensing section 40 may be directly formed on the display panel 10. In some embodiments, the input sensing section 40 may be separately formed, and then, may be combined with the display panel 10 through an adhesive layer, for example, such as an OCA. In an embodiment, as shown in FIG. 2, the input sensing section 40 may be formed directly on the display panel 10, and in this case, the adhesive layer may not be present between the input sensing section 40 and the display panel 10.

The optical functional section 50 may include an anti-reflection layer. The anti-reflection layer may reduce the reflectance of light (e.g., external light) that is incident toward the display panel 10 from the outside through the window 60. The anti-reflection layer may include a retarder and a polarizer. The retarder may include a film type retarder or a liquid crystal coating type retarder, and may include a half-wave ($\lambda/2$) retarder and/or a quarter-wave ($\lambda/4$) retarder. The polarizer may also include a film type polarizer or a liquid crystal coating type polarizer. The film type polarizer may include a stretched synthetic resin film, and the liquid crystal coating type polarizer may include liquid crystals arranged in a suitable array (e.g., a predetermined or certain array). Each of the retarder and the polarizer may further include a protective film.

In another embodiment, the anti-reflection layer may include a structure including a black matrix and color filters. The color filters may be arranged based on a color of light emitted by each pixel. In another embodiment, the anti-reflection layer may include a destructive interference structure. The destructive interference structure may include a first reflection layer and a second reflection layer, which are arranged at (e.g., in or on) different layers from each other. First reflection light and second reflection light reflected from the first reflection layer and the second reflection layer, respectively, may destructively interfere with each other, and thus, the reflectance of external light may be decreased.

The optical functional section 50 may include a lens layer. The lens layer may improve the emission efficiency of light emitted from the display panel 10, or may reduce a color deviation. The lens layer may include a layer having a concave lens shape or a convex lens shape, and/or a plurality of layers having different refractive indices from one another. The optical functional section 50 may include both the anti-reflection layer and the lens layer described above, or may include any suitable one from among the anti-reflection layer and the lens layer.

Each of the input sensing section 40 and the optical functional section 50 may include a hole. For example, the input sensing section 40 may include a first hole 40H penetrating into top and bottom surfaces of the input sensing section 40, and the optical functional section 50 may include a second hole 50H penetrating into top and bottom surfaces of the optical functional section 50. The first hole 40H and the second hole 50H may be arranged at (e.g., in or on) the first area A1, and may overlap with each other.

A component 20 may be arranged at (e.g., in or on) the first area A1. The component 20 may include an electronic element that uses light or sound. For example, the electronic element may include a sensor that measures a distance, for example, such as a proximity sensor, a sensor that recognizes a part of a user's body (e.g., a fingerprint, an iris, a face, and/or the like), a small lamp that outputs light, an image sensor (e.g., a camera) that captures an image, and/or the like. Electronic elements that use light may use light of various suitable wavelength bands, for example, such as visible light, infrared light, and/or ultraviolet light. Electronic elements that use sound may use ultrasonic waves or sound of other suitable frequency bands. As described above, the first area A1 may correspond to a transmission area through which light traveling toward the outside from the component 20 and/or light traveling toward the component 20 from the outside may be transmitted.

In another embodiment, when the display apparatus 1 is implemented in a smart watch or an instrument panel for a vehicle, the component 20 may correspond to an element, for example, such as a clock hand or a needle, that indicates information (e.g., a time of day, a vehicle speed, and/or the like). When the display apparatus 1 includes the clock hand or the instrument panel for a vehicle, the component 20 may be exposed to the outside through the window 60, and the window 60 may include an opening corresponding to the first area A1 through which the component 20 may be exposed.

The component 20 may include an element capable of adding a function to the display apparatus 1 as described above, or may include an element, for example, such as an accessory, that increases the aesthetics of the display panel 10.

Figure 3A:
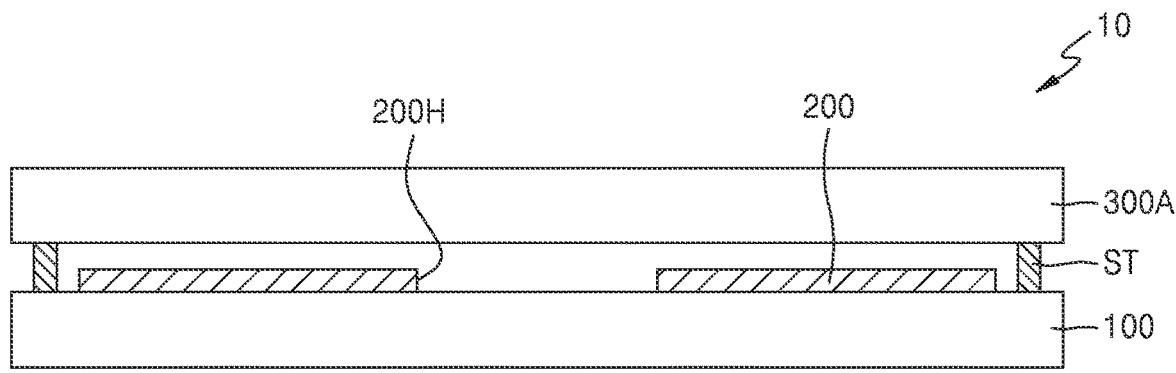
FIGS. 3A-3B are cross-sectional views schematically illustrating a display panel according to one or more embodiments.
Figure 3B:
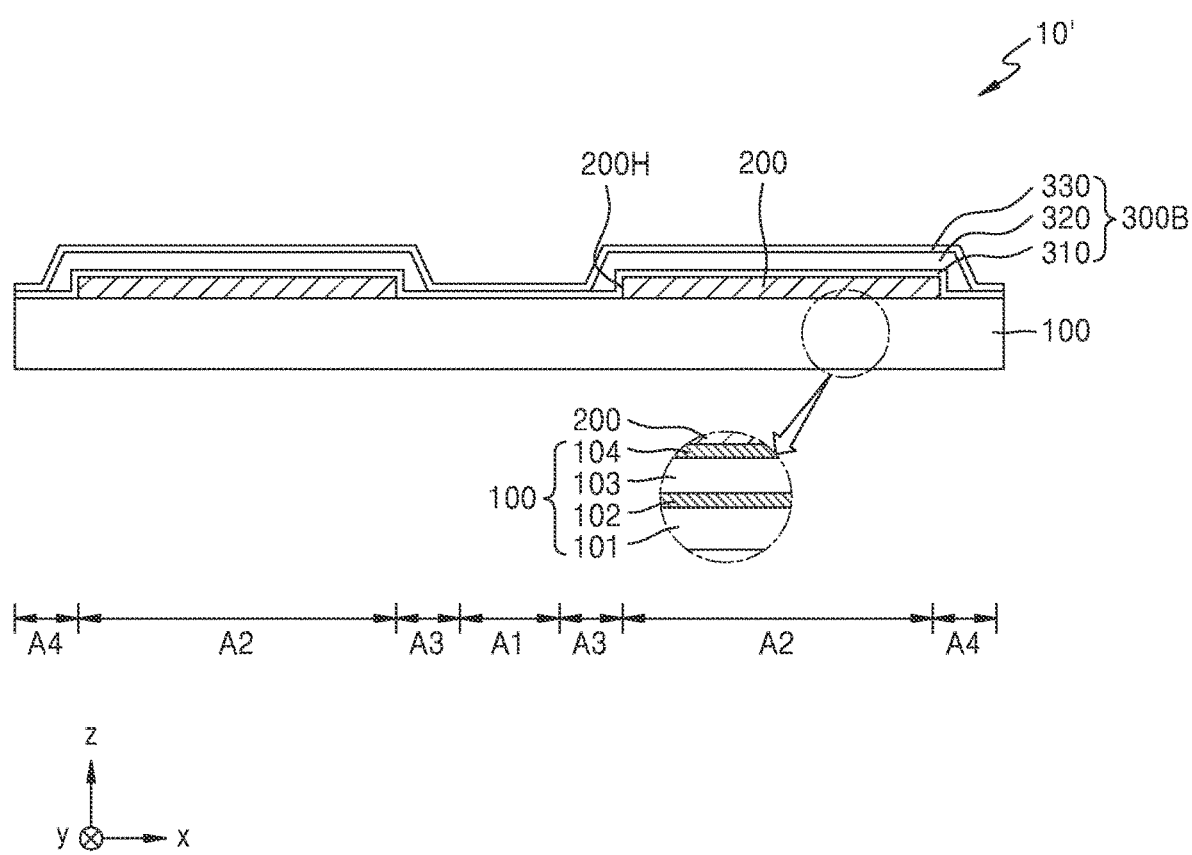

FIGS. 3A and 3B are cross-sectional views schematically illustrating a display panel 10 according to one or more embodiments.

Referring to FIG. 3A, the display panel 10 includes a substrate 100, and a display layer 200 arranged thereon. The substrate 100 may include a glass material or polymer resin. For example, the substrate 100 may include a glass material including $SiO_2$ as a main element, or may include a resin, for example, such as reinforced plastic.

The display layer 200 may be arranged to correspond to the second area A2, and may include a pixel circuit, and a light-emitting element electrically connected to the pixel circuit. The light-emitting element emits light from an emission area, and the emission area may be defined as a pixel. The pixel circuit may include a plurality of thin-film transistors and a storage capacitor, and the light-emitting element may include a light-emitting diode, for example, such as an organic light-emitting diode (OLED).

The display layer 200 may be covered with a sealing member. For example, the display layer 200 may be covered with an encapsulation substrate 300A. The encapsulation substrate 300A may include a glass material or polymer resin. For example, the encapsulation substrate 300A may include a glass material including $SiO_2$ as a main element, or may include a resin, for example, such as reinforced plastic. The encapsulation substrate 300A may be arranged to face the substrate 100, and a sealant ST may be arranged between the substrate 100 and the encapsulation substrate 300A. The sealant ST may be located at (e.g., in or on) the fourth area A4, and may entirely surround (e.g., around a periphery of) the display layer 200 between the substrate 100 and the encapsulation substrate 300A. In a view from a direction perpendicular to or substantially perpendicular to the top surface of the substrate 100 (e.g., in a plan view or on a plane), the second area A2 may be entirely surrounded (e.g., around a periphery thereof) by the sealant ST.

A portion of the display layer 200, for example, such as a portion corresponding to the first area A1, may be removed. In this regard, FIG. 3A shows that the display layer 200 includes a third hole 200H. The display layer 200 may not only include the above-described pixel circuits and light-emitting elements, but may also include insulating layers arranged between lines connected to each pixel circuit, between electrodes, and/or between electrodes of the light-emitting elements. For example, the third hole 200H may be formed by overlapping holes of the aforementioned insulating layers provided in the display layer 200 with each other. The third hole 200H of the display layer 200 may be formed to penetrate into the top and bottom surfaces of the display layer 200.

Referring to FIG. 3B, a display panel 10' may include a substrate 100, a display layer 200 on the substrate 100, and an encapsulation layer 300B as an encapsulating element covering the display layer 200. The encapsulation layer 300B may include at least one inorganic encapsulation layer, and at least one organic encapsulation layer. As an embodiment, FIG. 3B shows that the encapsulation layer 300B includes first and second inorganic encapsulation layers 310 and 330, and an organic encapsulation layer 320 therebetween.

Each of the first and second inorganic encapsulation layers 310 and 330 may include one or more suitable inorganic insulating materials. Each of the first and second inorganic encapsulation layers 310 and 330 may include one or more suitable inorganic insulating materials, for example, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide (ZnO), and may be formed by chemical vapor deposition (CVD) or the like.

The organic encapsulation layer 320 may include a polymer-based material. For example, the polymer-based material may include an acryl-based resin, an epoxy-based resin, polyimide, polyethylene, and/or the like. For example, the organic encapsulation layer 320 may include an acrylic resin, for example, such as polymethyl methacrylate, polyacrylic acid, or the like.

The first and second inorganic encapsulation layers 310 and 330 and the organic encapsulation layer 320 may be integrally formed to cover the first to fourth areas A1, A2, A3, and A4.

The substrate 100 may include a polymer resin, and may have a multilayered structure. For example, the substrate 100 may include a first base layer 101, a first barrier layer 102, a second base layer 103, and a second barrier layer 104, which are sequentially stacked on one another.

Each of the first and second base layers 101 and 103 may include a polymer resin. For example, each of the first and second base layers 101 and 103 may include polyimide (PI), polyethersulfone (PES), polyarylate, polyether imide (PEI), polyethylene naphthalate (PEN), polyethylene terephthalate (PET), polyphenylene sulfide (PPS), polycarbonate (PC), cellulose triacetate (TAC), and/or cellulose acetate propionate (CAP).

Each of the first and second barrier layers 102 and 104 may prevent or substantially prevent the penetration of foreign substances, and may include a single layer or multiple layers including an inorganic material, for example, such as silicon nitride, silicon oxynitride, and/or silicon oxide.

When the display panel 10' includes a multilayered substrate 100 including a polymer resin, and the encapsulation layer 300B, the flexibility of the display panel 10' may be enhanced.

Figure 4:
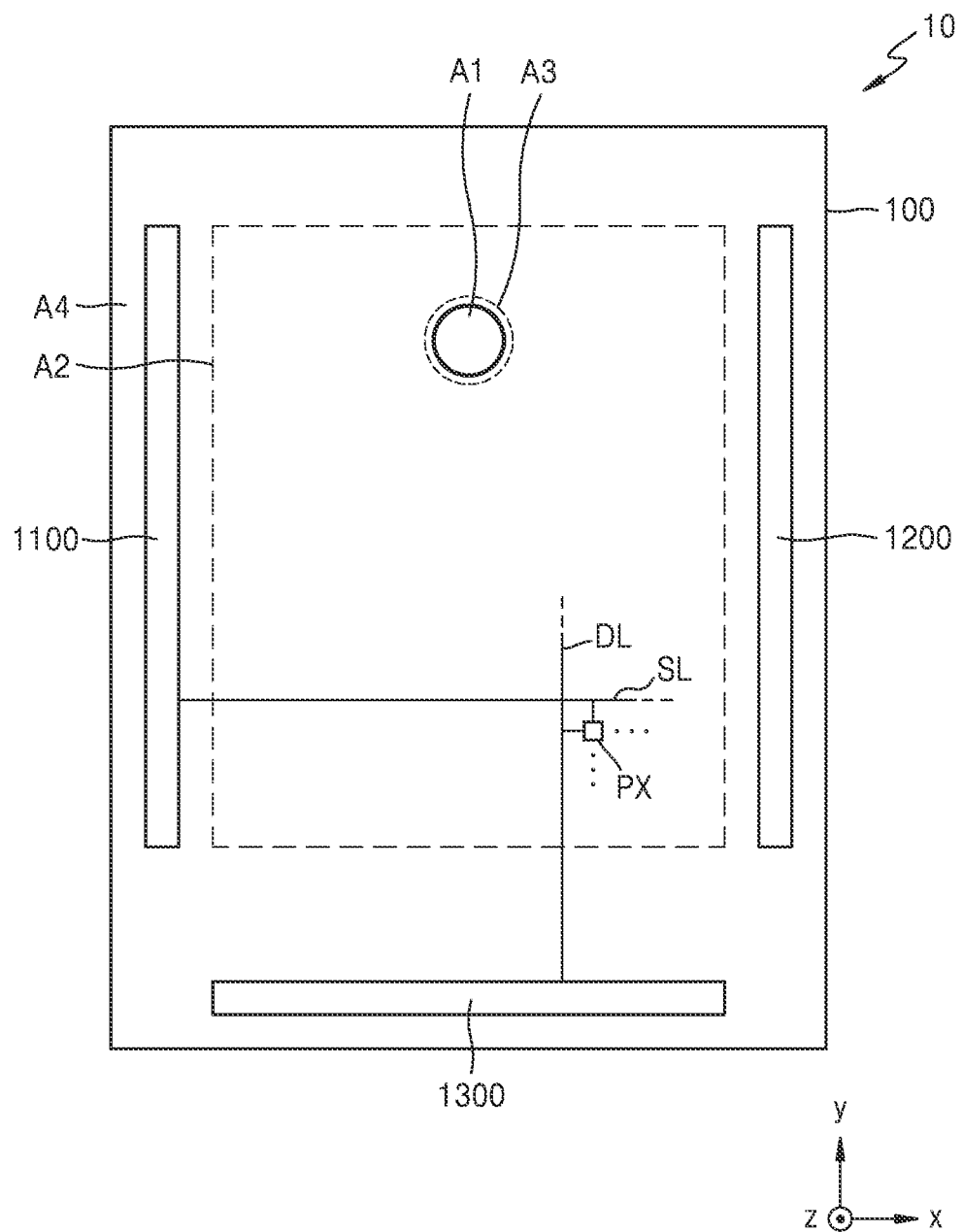
FIG. 4 is a schematic plan view of a display panel according to an embodiment.

FIG. 4 is a schematic plan view of the display panel 10 according to an embodiment.

Referring to FIG. 4, the display panel 10 may include the first area A1, the second area A2 surrounding (e.g., around a periphery of) the first area A1, the third area A3 between the first area A1 and the second area A2, and the fourth area A4 surrounding (e.g., around a periphery of) the second area A2.

The display panel 10 may include a plurality of pixels PX at (e.g., in or on) the second area A2. The pixel PX may be defined as an emission area from which light is emitted by a light-emitting element, for example, such as an OLED. Each pixel PX may emit one of a red light, a green light, and a blue light, or may emit one of a red light, a green light, a blue light, and a white light from the light-emitting element. The light-emitting element may be electrically connected to a corresponding pixel circuit, and may be driven by the corresponding pixel circuit. The pixel circuit may receive a data signal from a data line DL, and may receive a scan signal from a scan line SL.

The third area A3 may surround (e.g., around a periphery of) the first area A1. The third area A3 may include an area where no light-emitting elements, for example, such as an OLED, are arranged. Lines for providing an electrical signal to the pixel circuits corresponding to the pixels PX that are around (e.g., that are adjacent to) the first area A1 may pass through (e.g., may extend along) the third area A3.

A first scan driver 1100 and a second scan driver 1200 for providing a scan signal to a pixel circuit corresponding to each pixel PX, a data driver 1300 for providing a data signal to the pixel circuit, and a main power line for providing first and second power voltages may be arranged at (e.g., in or on) the fourth area A4. The first scan driver 1100 and the second scan driver 1200 may be arranged at (e.g., in or on) the fourth area A4, and may be arranged at opposite sides of the second area A2, respectively, with the second area A2 therebetween.

FIG. 4 shows that the data driver 1300 is arranged to be adjacent to one side (e.g., a lower end) of the substrate 100, but the data driver 1200 may be arranged on a flexible printed circuit board (FPCB) that is electrically connected to a pad at one side of the display panel 10, according to another embodiment.

Figure 5:
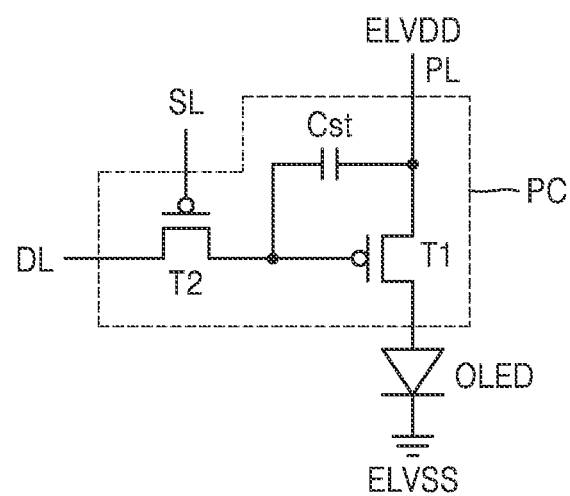
FIG. 5 is an equivalent circuit diagram of a pixel circuit according to an embodiment.

FIG. 5 is an equivalent circuit diagram of a pixel circuit PC according to an embodiment.

Referring to FIG. 5, the pixel circuit PC may include a plurality of thin-film transistors and a storage capacitor, and may be electrically connected to an organic light-emitting diode OLED. In an embodiment, the pixel circuit PC may include a driving thin-film transistor T1, a switching thin-film transistor T2, and a storage capacitor Cst.

The switching thin-film transistor T2 may be connected to a scan line SL and a data line DL, and may transmit a data signal or a data voltage received from the data line DL to the driving thin-film transistor T1 according to (e.g., based on) a scan signal or a switching voltage received from the scan line SL. The storage capacitor Cst may be connected to the switching thin-film transistor T2 and a driving voltage line PL, and may store a voltage difference between a voltage received from the switching thin-film transistor T2 and a first power voltage ELVDD applied to the driving power line PL.

The driving thin-film transistor T1 may be connected to the driving voltage line PL and the storage capacitor Cst, and may control a driving current flowing from the driving voltage line PL to the organic light-emitting diode OLED in response to the voltage stored in the storage capacitor Cst. A common electrode (e.g., a cathode) of the organic light-emitting diode OLED may receive a second power voltage ELVSS. The organic light-emitting diode OLED may emit light having a luminance based on the driving current.

Although a case where the pixel circuit PC includes two thin-film transistors and one storage capacitor is described and shown in FIG. 5, the present disclosure is not limited thereto. For example, the pixel circuit PC may include three or more thin-film transistors and/or two or more storage capacitors. In an embodiment, the pixel circuit PC may include seven thin-film transistors and one storage capacitor. The number of thin-film transistors and the number of storage capacitors may be variously modified according to a design of the pixel circuit PC. However, for convenience of description and illustration, a case where the pixel circuit PC includes the two thin-film transistors and the one storage capacitor is described in more detail below.

Figure 6:
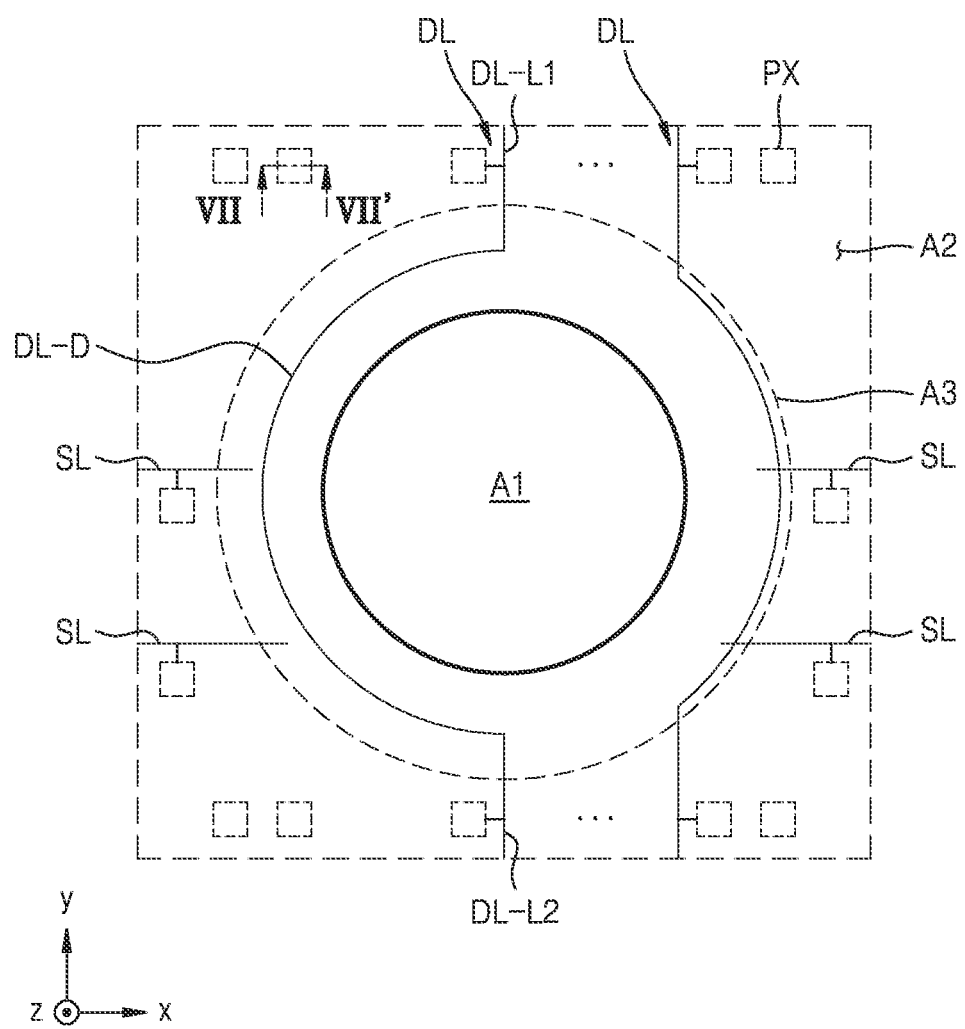
FIG. 6 is a plan view schematically illustrating a portion of a display panel according to an embodiment.

FIG. 6 is a plan view schematically illustrating a portion of a display panel according to an embodiment.

Referring to FIG. 6, some of the pixels PX at (e.g., in or on) the second area A2 may be spaced apart from each other with respect to the first area A1. For example, the first area A1 may be positioned between two pixels PX that are arranged along the ±x direction. Similarly, the first area A1 may be positioned between two pixels PX that are arranged along the ±y direction.

Two pixels PX that are arranged along the ±y direction with the first area A1 therebetween may be electrically connected to the same data line DL, and the data line DL may be bent at (e.g., in or on) the third area A3 to bypass the first area A1. For example, a portion of the data line DL may be bent, and may extend along an edge of the first area A1 at (e.g., in or on) the third area A3, for example, in an arc direction of the first area A1. The data line DL may include first and second portions DL-L1 and DL-L2, each extending in the ±y direction and passing along the second area A2, and a third portion DL-D connected to each of the first and second portions DL-L1 and DL-L2, and extending in the arc direction of the first area A1 at (e.g., in or on) the third area A3.

Two pixels PX that are arranged along the ±x direction with the first area A1 therebetween may be electrically connected to different scan lines SL, respectively. The scan lines SL arranged at (e.g., in or on) the left side of the first area A1 may each be electrically connected to the first scan driver 1100 described above with reference to FIG. 4, and the scan lines SL arranged at (e.g., in or on) the right side of the first area A1 may each be electrically connected to the second scan driver 1200 described above with reference to FIG. 4. As illustrated in FIG. 4, when the display panel 10 includes the two scan drivers 1100 and 1200, the pixels PX at opposite sides of the first area A1 may be electrically connected to the scan lines SL that are spaced apart from each other, respectively.

As another embodiment, in a case where the second scan driver 1200 is omitted, the two pixels PX arranged along the ±x direction with the first area A1 therebetween may be connected to the same scan line SL, and like the data line DL, the scan line SL may include a portion extending in the arc direction of the first area A1 at (e.g., in or on) the third area A3.

As described above, the lines electrically connected to the pixel circuits corresponding to the pixels PX, respectively, such as a portion of the data line DL and/or a portion of the scan line SL, may be arranged at (e.g., in or on) the third area A3.

Figure 7:
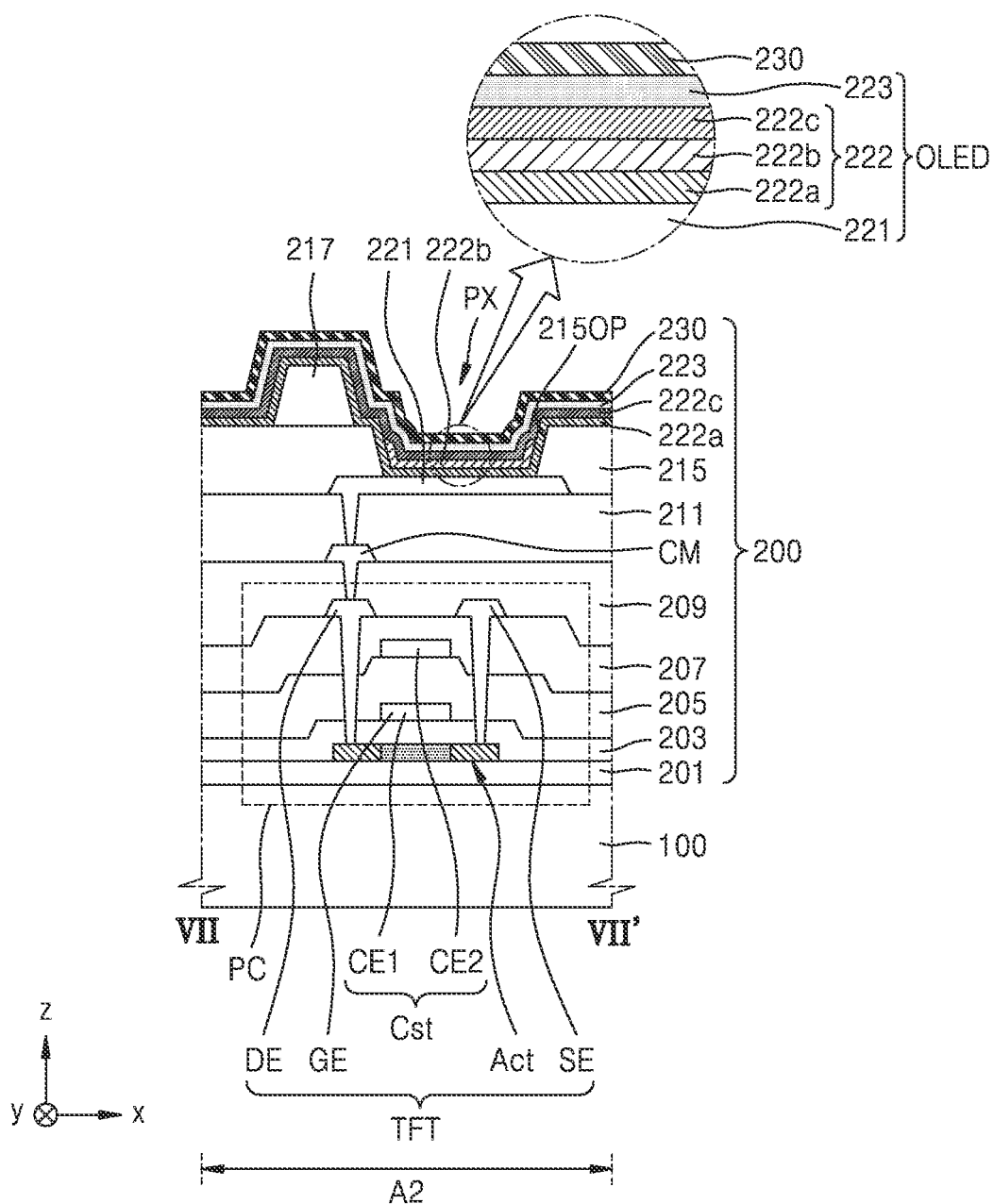
FIG. 7 is a cross-sectional view schematically illustrating a portion of a display panel according to an embodiment.

FIG. 7 is a cross-sectional view schematically illustrating a portion of a display panel according to an embodiment. FIG. 7 is a cross-section view taken along the line VII-VII' of the display panel of FIG. 6.

Referring to FIG. 7, a pixel circuit PC may be arranged on a substrate 100, and an organic light-emitting diode OLED that is electrically connected to the pixel circuit PC may be arranged on the pixel circuit PC. As described above with reference to FIGS. 3A and 3B, the substrate 100 may include glass or a polymer resin. The substrate 100 may include a single layer or multiple layers.

A buffer layer 201 may be formed on the substrate 100 to prevent or substantially prevent impurities from penetrating into a semiconductor layer Act of a thin-film transistor TFT. The buffer layer 201 may include an inorganic insulating material, for example, such as silicon nitride, silicon oxynitride, and/or silicon oxide, and may include a single layer or multiple layers including one or more of the aforementioned inorganic insulating materials.

The pixel circuit PC may be arranged on the buffer layer 201. The pixel circuit PC may include the thin-film transistor TFT, and a storage capacitor Cst. The thin-film transistor TFT may include the semiconductor layer Act, a gate electrode GE, a source electrode SE, and a drain electrode DE. The thin-film transistor TFT shown in FIG. 7 may correspond to one of the transistors described above with reference to FIG. 5, for example, such as the driving transistor T1. In the present embodiment, the thin-film transistor TFT is shown as a top gate type thin-film transistor in which the gate electrode GE is arranged on the semiconductor layer Act with a gate insulating layer 203 therebetween, but the present disclosure is not limited thereto, and according to another embodiment, the thin-film transistor TFT may be a bottom gate type thin-film transistor.

The semiconductor layer Act may include polysilicon. In some embodiments, the semiconductor layer Act may include amorphous silicon, an oxide semiconductor, an organic semiconductor, or the like. The gate electrode GE may include one or more low-resistance metallic materials. The gate electrode GE may include a conductive material including molybdenum (Mo), aluminum (Al), copper (Cu), titanium (Ti), and/or the like, and may include multiple layers or a single layer including one or more of the above materials.

The gate insulating layer 203 between the semiconductor layer Act and the gate electrode GE may include an inorganic insulating material, for example, such as silicon oxide, silicon nitride, silicon oxynitride, aluminum oxide, titanium oxide, tantalum oxide, hafnium oxide, and/or the like. The gate insulating layer 203 may have a single layer or multiple layers including one or more of the above materials.

Each of the source electrode SE and the drain electrode DE may include one or more suitable materials having a suitable conductivity (e.g., a good conductivity). Each of the source electrode SE and the drain electrode DE may include a conductive material including Mo, Al, Cu, Ti, and/or the like, and may include multiple layers or a single layer including one or more of the above materials. In an embodiment, each of the source electrode SE and the drain electrode DE may include multiple layers including a Ti layer, an Al layer, and another Ti layer.

The storage capacitor Cst may include a lower electrode CE1 and an upper electrode CE2, which overlap with each other with a first interlayer insulating layer 205 therebetween. The storage capacitor Cst may overlap with the thin-film transistor TFT. In this regard, FIG. 7 shows that the gate electrode GE of the thin-film transistor TFT corresponds to the lower electrode CE1 of the storage capacitor Cst. In another embodiment, the storage capacitor Cst may not overlap with the thin-film transistor TFT. The storage capacitor Cst may be covered with a second interlayer insulating layer 207.

Each of the first interlayer insulating layer 205 and the second interlayer insulating layer 207 may include an inorganic insulating material, for example, such as silicon oxide, silicon nitride, silicon oxynitride, aluminum oxide, titanium oxide, tantalum oxide, hafnium oxide, and/or the like. Each of the first interlayer insulating layer 205 and the second interlayer insulating layer 207 may include a single layer or multiple layers including one or more of the above materials.

The pixel circuit PC including the thin-film transistor TFT and the storage capacitor Cst may be covered with a first organic insulating layer 209. The first organic insulating layer 209 may be flat or substantially flat, and may include a surface having a flat or substantially flat top surface. The first organic insulating layer 209 may include an organic insulating material, for example, such as a general purpose polymer such as poly(methyl methacrylate) (PMMA) or polystyrene (PS), a polymer derivative having a phenolic group, an acryl-based polymer, an imide-based polymer, aryl-ether-based polymer, amide-based polymer, fluorine-based polymer, p-xylene-based polymer, vinyl alcohol-based polymer, and/or any suitable blends thereof. In an embodiment, the first organic insulating layer 209 may include polyimide.

A contact metal CM may be formed on the first organic insulating layer 209. The contact metal CM may include a conductive material including Mo, Al, Cu, Ti, and/or the like, and may include multiple layers or a single layer including one or more of the above materials. The contact metal CM may include the same material as that of the source electrode SE and/or the drain electrode DE of the thin-film transistor TFT. For example, the contact metal CM may include multiple layers including a Ti layer, an Al layer, and another Ti layer.

A second organic insulating layer 211 may be formed on the contact metal CM. The second organic insulating layer 211 may include a surface having a flat or substantially flat top surface. The second organic insulating layer 211 may include an organic insulating material, for example, such as a general purpose polymer such as poly(methyl methacrylate) (PMMA) or polystyrene (PS), a polymer derivative having a phenol-based group, an acryl-based polymer, an imide-based polymer, aryl-ether-based polymer, amide-based polymer, fluorine-based polymer, p-xylene-based polymer, vinyl alcohol-based polymer, and/or any suitable blends thereof. In an embodiment, the second organic insulating layer 211 may include polyimide. In some embodiments, an inorganic insulating layer may be further arranged between the first organic insulating layer 209 and the second organic insulating layer 211.

A pixel electrode 221 may be formed on the second organic insulating layer 211. The pixel electrode 221 may include a conductive oxide, for example, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include a reflective film including silver (Ag), magnesium (Mg), Al, platinum (Pt), palladium (Pd), gold (Au), nickel (Ni), neodymium (Nd), iridium (Ir), chromium (Cr), or any suitable compounds thereof. In another embodiment, the pixel electrode 221 may further include a layer including ITO, IZO, ZnO, or $In_2O_3$ on and/or below the reflective layer.

A pixel-defining layer 215 may be formed on the pixel electrode 221. The pixel-defining layer 215 may include an opening 2150P through which an upper surface of the pixel electrode 221 is exposed, and may cover edges of the pixel electrode 221. The opening 2150P may define an emission area of light emitted by the organic light-emitting diode OLED. For example, a size/width of the opening 215OP may correspond to a size/width of the emission area. Thus, a size and/or width of the pixel PX may depend on the size and/or width of the opening 215OP of the corresponding pixel-defining layer 215.

The pixel-defining layer 215 may include an organic insulating material. In some embodiments, the pixel-defining layer 215 may include an inorganic insulating material, for example, such as silicon nitride, silicon oxynitride, or silicon oxide. In some embodiments, the pixel-defining layer 215 may include both an organic insulating material and an inorganic insulating material.

An intermediate layer 222 may include an emission layer 222b. For example, the emission layer 222b may include an organic material. The emission layer 222b may include a polymer or a low molecular organic material that emits light of a desired color. The intermediate layer 222 may include a first functional layer 222a arranged below the emission layer 222b, and/or a second functional layer 222c arranged on (e.g., above) the emission layer 222b.

The first function layer 222a may include a single layer or multiple layers. For example, when the first functional layer 222a includes a polymer material, the first functional layer 222a may include poly-(3,4)-ethylene-dihydroxy thiophene (PEDOT) or polyaniline (PANI) as a hole transport layer (HTL) that is a single layer. When the first functional layer 222a includes a low molecular material, the first functional layer 222a may include a hole injection layer (HIL) and the HTL.

The second functional layer 222c may be optional depending on a structure of the light emitting element. For example, when each of the first functional layer 222a and the emission layer 222b includes a polymer material, the second functional layer 222c may be formed. The second functional layer 222c may include a single layer or multiple layers. The second functional layer 222c may include an electron transport layer (ETL) and/or an electron injection layer (EIL).

The emission layer 222b of the intermediate layer 222 may be arranged for each pixel at (e.g., in or on) the second area A2. The emission layer 222b may overlap with an opening of the pixel-defining layer 215 and/or the pixel electrode 221. Each of the first and second functional layers 222a and 222c of the intermediate layer 222 may be formed as a single body not only at (e.g., in or on) the second area A2, but also at (e.g., in or on) the third area A3 described above with reference to FIG. 5.

An opposite electrode 223 may include a conductive material having a low work function. For example, the opposite electrode 223 may include a (semi-) transparent layer including Ag, Mg, Al, Pt, Pd, Au, Ni, Nd, Ir, Cr, Li, Ca, or any suitable alloys thereof. In some embodiments, the opposite electrode 223 may further include a layer including ITO, IZO, ZnO, or $In_2O_3$ on the (semi-)transparent layer including one or more of the above-described materials. The opposite electrode 223 may be formed as a single body, and may cover a plurality of pixel electrodes 221 at (e.g., in or on) the second area A2. The intermediate layer 222 and the opposite electrode 223 may be formed by thermal evaporation.

A spacer 217 may be formed on the pixel-defining layer 215. The spacer 217 may include an organic insulating material, for example, such as polyimide. In some embodiments, the spacer 213 may include an inorganic insulating material, for example, such as silicon nitride or silicon oxide, or may include both an organic insulating material and an inorganic insulating material.

The spacer 217 may include a material that is different from a material of the pixel-defining layer 215. In some embodiments, the spacer 217 may include the same material as that of the pixel-defining layer 215, and in this case, the pixel-defining layer 215 and the spacer 217 may be formed together in a mask process using a halftone mask, or the like. In an example, each of the pixel-defining layer 215 and the spacer 217 may include polyimide.

A capping layer 230 may be arranged on the opposite electrode 223. The capping layer 230 may include lithium fluoride (LiF), an inorganic material, and/or an organic material. In an embodiment, the capping layer 230 may be omitted.

Figure 8:
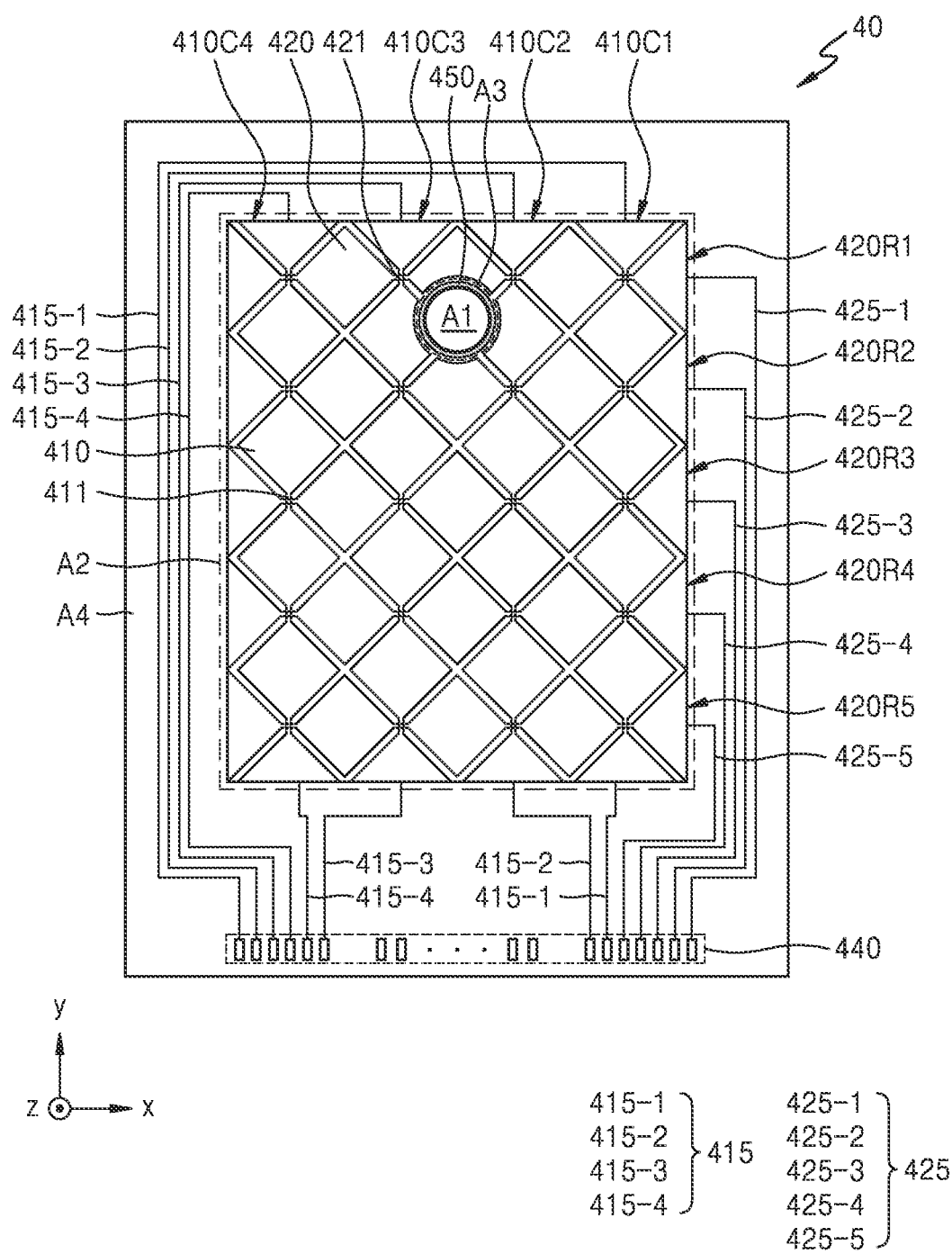
FIG. 8 is a plan view schematically illustrating an input sensing section on a display panel according to an embodiment.

FIG. 8 is a plan view schematically illustrating the input sensing section 40 on a display panel according to an embodiment.

Referring to FIG. 8, the input sensing section 40 may include first sensing electrodes 410, first trace lines 415-1 to 415-4 connected to the first sensing electrodes 410, second sensing electrodes 420, and second trace lines 425-1 to 425-5 connected to the second sensing electrodes 420. The first sensing electrodes 410 and the second sensing electrodes 420 may be arranged at (e.g., in or on) the second area A2, and the first trace lines 415-1 to 415-4 and the second trace lines 425-1 to 425-5 may be arranged at (e.g., in or on) the fourth area A4.

The first sensing electrodes 410 may be arranged along the ±y direction, and the second sensing electrodes 420 may be arranged along the ±x direction crossing the ±y direction. The first sensing electrodes 410 arranged along the ±y direction may be connected to each other by a first connection electrode 411 located between the first sensing electrodes 410 that are adjacent to each other, and a plurality of first sensing lines 410C1 to 410C4 may be formed therefrom. The second sensing electrodes 420 arranged along the ±x direction may be connected to each other by a second connection electrode 421 located between the second sensing electrodes 420 that are adjacent to each other, and a plurality of second sensing lines 420R1 to 420R5 may be formed therefrom. The first sensing lines 410C1 to 410C4 and the second sensing lines 420R1 to 420R5 may cross each other. For example, the first sensing lines 410C1 to 410C4 and the second sensing lines 420R1 to 420R5 may intersect with each other.

Each of the first sensing lines 410C1 to 410C4 may be connected to a pad of a sensing signal pad unit (e.g., a sensing signal pad terminal area) 440 by the first trace lines 415-1 to 415-4 formed at (e.g., in or on) the fourth area A4. For example, the first trace lines 415-1 to 415-4 may be connected to upper and lower sides of the first sensing lines 410C1 to 410C4, respectively, and thus, may have a double-routing structure. The first trace lines 415-1 to 415-4 connected to the upper and lower sides of the first sensing lines 410C1 to 410C4 may be connected to a plurality of pads of the sensing signal pad unit 440, respectively.

The second sensing lines 420R1 to 420R5 may be connected to the pads of the sensing signal pad unit 440 through the second trace lines 425-1 to 425-5 formed at (e.g., in or on) the fourth area A4, respectively. For example, the second trace lines 425-1 to 425-5 may be connected to a plurality of pads of the sensing signal pad unit 440, respectively.

As described above with reference to FIGS. 1 and 2, the first area A1 may correspond to an area at (e.g., in or on) which components may be arranged, and the sensing electrodes may not be arranged at (e.g., in or on) the first area A1. A shielding portion 450 may be arranged around (e.g., a periphery of) the first area A1, for example, at (e.g., in or on) the third area A3, and thus, visual recognition of the lines arranged at (e.g., in or on) the third area A3 to a user may be reduced or minimized.

FIG. 8 shows a double-routing structure in which the first trace lines 415-1 to 415-4 are connected to the upper and lower sides of the first sensing lines 410C1 to 410C4, respectively, and such a double-routing structure may improve sensing sensitivity. However, the present disclosure is not limited thereto. In another embodiment, the input sensing section 40 may have a single-routing structure in which each of the first trace lines 415-1 to 415-4 is connected to the upper side or the lower side of a corresponding one of the first sensing lines 410C1 to 410C4.

Figure 9:
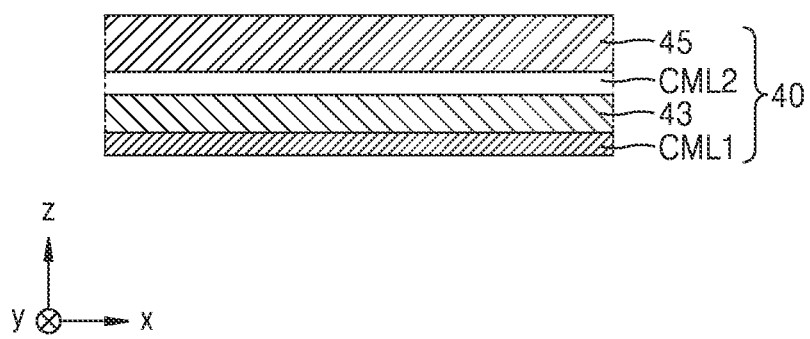
FIG. 9 is a cross-sectional view illustrating a stacked structure of an input sensing section according to an embodiment.

FIG. 9 is a cross-sectional view illustrating a stacked structure of the input sensing section 40 according to an embodiment.

Referring to FIG. 9, the input sensing section 40 may include a first conductive layer CML1 and a second conductive layer CML2. A first insulating layer 43 may be located between the first conductive layer CML1 and the second conductive layer CML2, and a second insulating layer 45 may be located on the second conductive layer CML2. Each of the first sensing electrodes 410, the first connection electrodes 411, the second sensing electrodes 420, and the second connection electrodes 421 described above with reference to FIG. 8 may be included at (e.g., in or on) one of the first conductive layer CML1 and the second conductive layer CML2.

Each of the first and second conductive layers CML1 and CML2 may include a metal layer or a transparent conductive layer. The metal layer may include Mo, mendelevium (Mb), Ag, Ti, Cu, Al, and/or any suitable alloys thereof. The transparent conductive layer may include a transparent conductive oxide, for example, such as ITO, IZO, ZnO, indium tin zinc oxide (ITZO), and/or the like. In addition, the transparent conductive layer may include a conductive polymer, for example, such as PEDOT, metal nano wires, graphene, and/or the like.

Each of the first and second conductive layers CML1 and CML2 may include a single layer or multiple layers. Each of the first and second conductive layers CML1 and CML2 including a single layer may include a metal layer or a transparent conductive layer, and example materials of the metal layer and the transparent conductive layer are described above. One of the first and second conductive layers CML1 and CML2 may include a single metal layer. The single metal layer may include a Mo, layer or an alloy layer of Mo and Mb. One of the first or second conductive layers CML1 and CML2 may include a metal layer including multiple layers. For example, the multi-layered metal layer may include a triple layer including a Ti layer, an Al layer, and another Ti layer, or may include a double layer including a Mo layer and an Mb layer. In some embodiments, the multi-layered metal layer may include a metal layer and a transparent conductive layer. The first and second conductive layers CML1 and CML2 may have different stacked structures from each other, or may have the same or substantially the same stacked structure as each other. For example, the first conductive layer CML1 may include a metal layer, and the second conductive layer CML2 may include a transparent conductive layer. In some embodiments, the first and second conductive layers CML1 and CML2 may include the same or substantially the same metal layer as each other.

Materials of the first and second conductive layers CML1 and CML2, and an arrangement of the sensing electrodes provided at (e.g., in or on) the first and second conductive layers CML1 and CML2, may be determined based on a desired sensing sensitivity. A resistor-capacitor (RC) delay may affect the sensing sensitivity. As the sensing electrodes including a metal layer have a relatively less resistance compared with the transparent conductive layer, an RC value thereof may be decreased. Thus, a charge time of a capacitor defined between the sensing electrodes may decrease. The sensing electrodes including the transparent conductive layer, when compared with the metal layer, may not be visually recognized by a user, and may have an increased input area so as to increase capacitance.

Each of the first and second insulating layers 43 and 45 may include an inorganic insulating material and/or an organic insulating material. The inorganic insulating material may include silicon oxide, silicon nitride, or silicon oxynitride, and the organic insulating material may include a polymer organic material.

Some of the first and second sensing electrodes 410 and 420 and the first and second connection electrodes 411 and 421 described with reference to FIG. 8 may be located at (e.g., in or on) the first conductive layer CML1, and other ones thereof may be located at (e.g., in or on) the second conductive layer CML2. In an embodiment, the first conductive layer CML1 may include the first connection electrodes 411, and the second conductive layer CML2 may include the first sensing electrodes 410, the second sensing electrodes 420, and the second connection electrodes 421 (e.g., see FIG. 8). In another embodiment, the first conductive layer CML1 may include the first sensing electrodes 410, the second sensing electrodes 420, and the second connection electrodes 421, and the second conductive layer CML2 may include the first connection electrodes 411. In another embodiment, the first conductive layer CML1 may include the first sensing electrodes 410 and the first connection electrodes 411, and the second conductive layer CML2 may include the second sensing electrodes 420 and the second connection electrodes 421. In this case, the first sensing electrodes 410 and the first connection electrode 411 may be provided at (e.g., in or on) the same layer as each other and may be integrally connected to each other, and the second sensing electrodes 420 and the second connection electrode 421 may be provided at (e.g., in or on) the same layer as each other. Thus, a contact hole may not be provided in an insulating layer between the first conductive layer CML1 and the second conductive layer CML2.

While FIG. 9 shows that the input sensing section 40 includes the first conductive layer CML1, the first insulating layer 43, the second conductive layer CML2, and the second insulating layer 45, the present disclosure is not limited thereto, and in another embodiment, the input sensing section 40 may further include a layer including an inorganic insulating material or an organic insulating material that may be further arranged below the first conductive layer CML1.

Figure 10A:
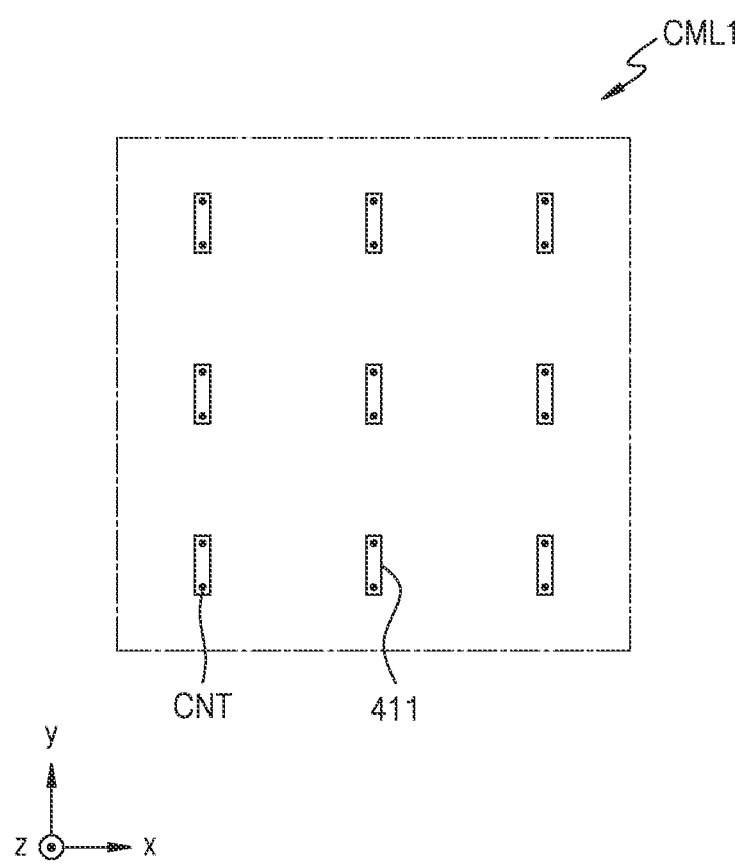
FIGS. 10A-10B are plan views illustrating a first conductive layer and a second conductive layer, respectively, of an input sensing section according to an embodiment.
Figure 10B:
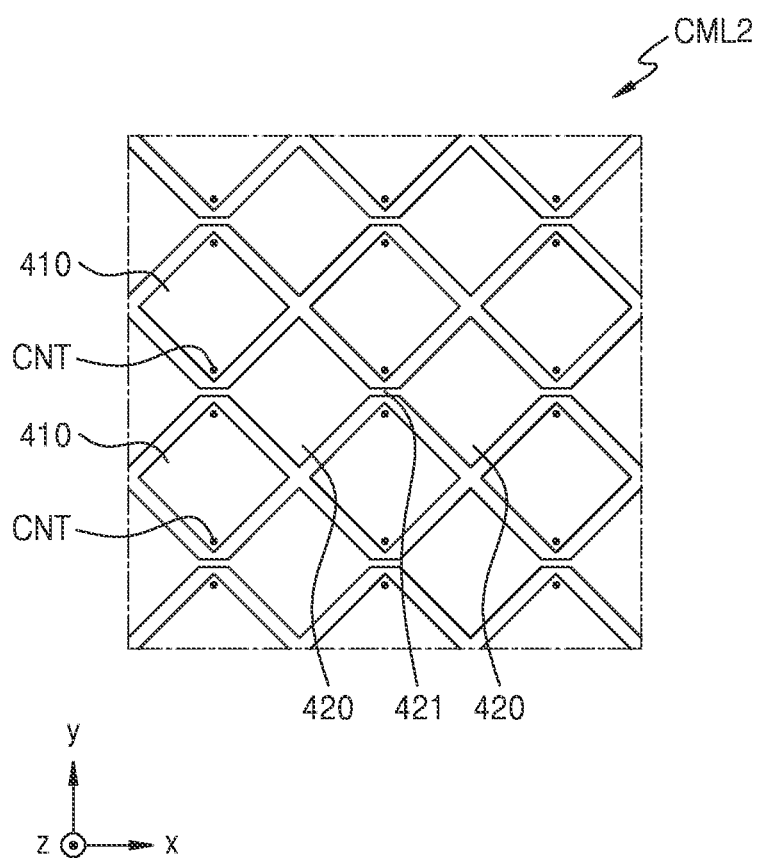

FIGS. 10A and 10B are plan views illustrating the first conductive layer CML1 and the second conductive layer CML2, respectively, of the input sensing section 40 according to an embodiment.

Referring to FIGS. 10A and 10B, in an embodiment, the first conductive layer CML1 may include the first connection electrodes 411, and the second conductive layer CML2 may include the first sensing electrodes 410, the second sensing electrodes 420, and the second connection electrodes 421. While, as discussed above, the configurations of the first conductive layer CML1 and the second conductive layer CML2 are not limited to those shown in FIGS. 10A and 10B, hereinbelow, for convenience of description and illustration, the configurations shown in FIGS. 10A and 10B will be mainly described in more detail.

The second sensing electrodes 420 may be connected to each other by the second connection electrodes 421 that are formed at (e.g., in or on) the same layer as that of the second sensing electrodes 420. For example, the second sensing electrodes 420 may include the same or substantially the same material as that of the second connection electrodes 421, and may be integrally formed (e.g., unitarily formed) with the second connection electrodes 421. The first sensing electrodes 410 may be connected to each other by the first connection electrodes 411 that are formed at (e.g., in or on) a layer different from a layer at (e.g., in or on) which the first sensing electrodes 410 are formed. The first connection electrode 411 that electrically connects adjacent ones of the first sensing electrodes 410 to each other may be connected to the adjacent ones of the first sensing electrodes 410 via a contact hole CNT formed in the first insulating layer 43 (e.g., see FIG. 9).

When each of the first and second sensing electrodes 410 and 420 includes a transparent conductive layer, the first and second sensing electrodes 410 and 420 may have a square shape or diamond shape in a plan view as shown in FIG. 10B, and may have an area corresponding to the above-described shape. Thus, the input area may be relatively large (e.g., may be relatively increased), and the capacitance may be increased. When each of the first and second sensing electrodes 410 and 420 includes a transparent conductive layer, the second conductive layer CML2 may include a transparent conductive material, and the first conductive layer CML1 may include a metal.

Figure 11A:
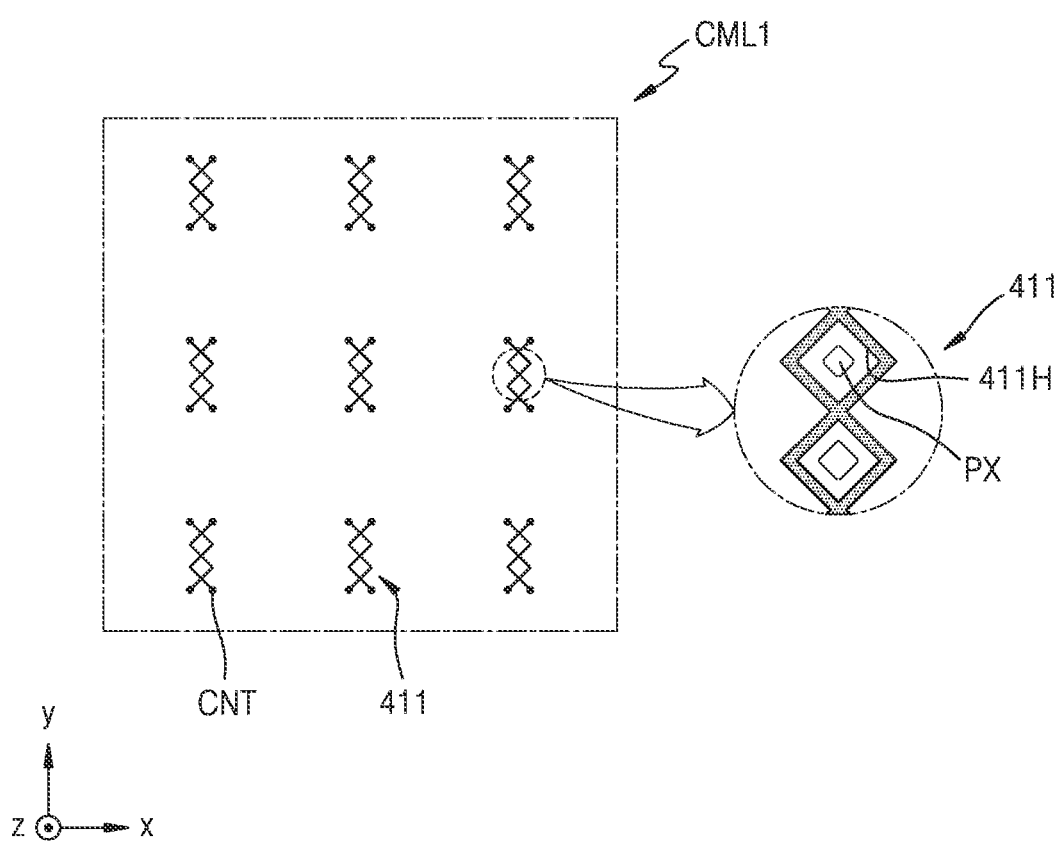
FIGS. 11A-11B are plan views illustrating a first conductive layer and a second conductive layer, respectively, of an input sensing section according to another embodiment.
Figure 11B:
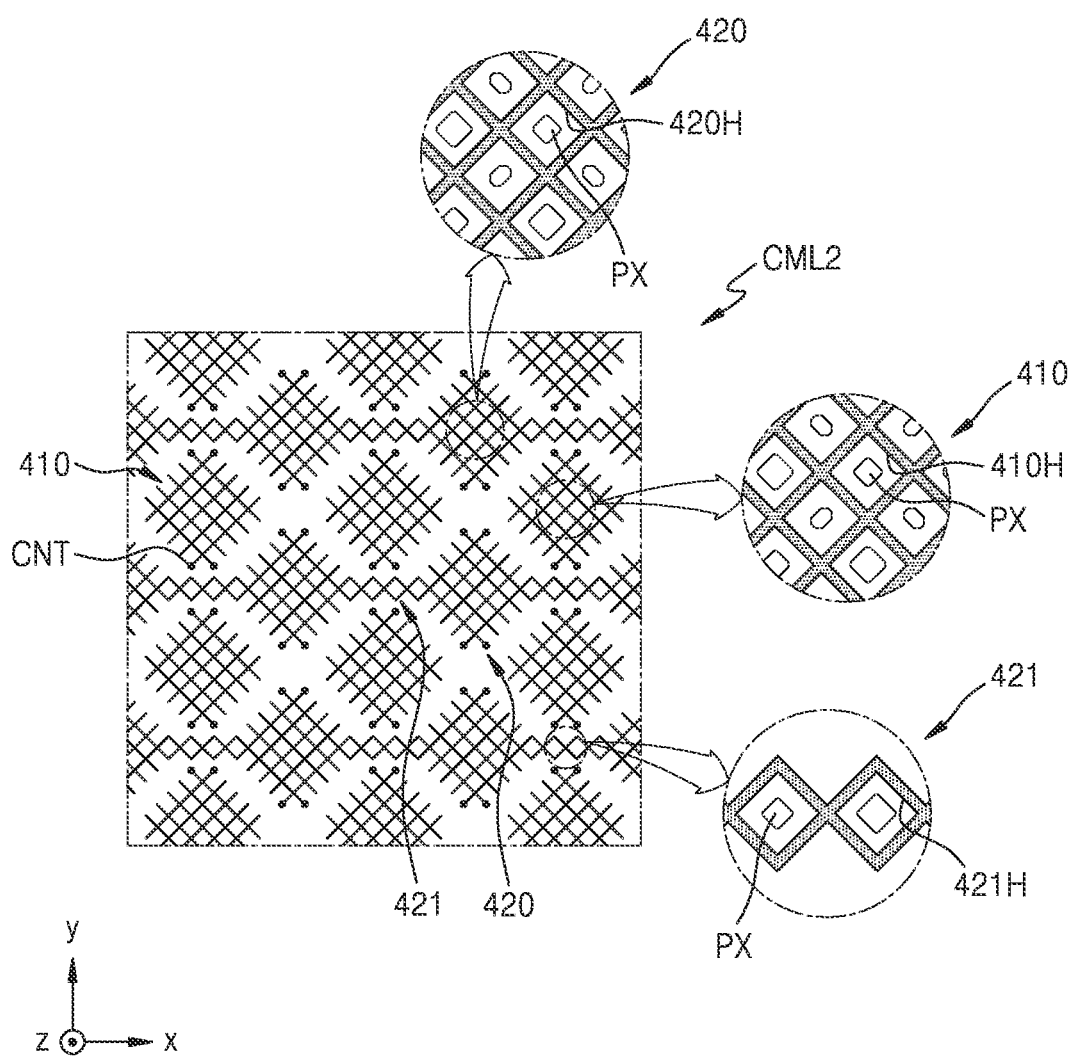

FIGS. 11A and 11B are plan views illustrating the first conductive layer CML1 and the second conductive layer CML2, respectively, of the input sensing section 40 according to another embodiment.

Referring to FIGS. 11A and 11B, each of first and second sensing electrodes 410 and 420 and each of the first and second connection electrodes 411 and 421 may have a mesh (or a grid) shape. When each of the first and second sensing electrodes 410 and 420 includes a metal layer, the first and second sensing electrodes 410 and 420 may have the mesh shape as shown in FIGS. 11A and 11B, so as to prevent or substantially prevent a visual recognition by the user, and/or to transmit light emitted by each pixel PX therethrough.

As shown in the enlarged views in FIGS. 11A and 11B, the first and second sensing electrodes 410 and 420 may each have a mesh-shaped metal layer including holes 410H and 420H, respectively. Similarly, the first and second connection electrodes 411 and 421 may each also have a mesh-shaped metal layer including holes 411H and 421H, respectively. The holes 410H, 420H, 411H, and 421H may overlap with the pixel PX.

As shown in FIG. 11A, the first conductive layer CML1 may include the first connection electrode 411. The first connection electrode 411 may electrically connect the first sensing electrodes 410 to each other, and the first sensing electrodes 410 may be formed at (e.g., in or on) a layer different from a layer at (e.g., in or on) which the first connection electrode 411 is formed. The first connection electrode 411 that electrically connects adjacent ones of the first sensing electrodes 410 to each other may be connected to the adjacent ones of the first sensing electrodes 410 via a contact hole CNT formed in the first insulating layer 43 (e.g., see FIG. 9).

As shown in FIG. 11B, the second conductive layer CML2 may include the first sensing electrode 410, the second sensing electrode 420, and the second connection electrode 421. The second sensing electrodes 420 may be connected to each other by the second connection electrodes 421 that are formed at (e.g., in or on) the same layer as that of the second sensing electrodes 420. For example, the second sensing electrodes 420 may include the same or substantially the same material as that of the second connection electrodes 421, and may be integrally formed (e.g., may be unitarily formed) with the second sensing electrodes 420. The first sensing electrodes 410 may be electrically connected to each other by the first connection electrodes 411 that are formed at (e.g., in or on) a layer different from a layer at (e.g., in or on) which the first sensing electrodes 410 are formed. The first sensing electrodes 410 may be connected to corresponding ones of the first connection electrodes 411 via the contact hole CNT formed in the first insulating layer 43 (e.g., see FIG. 9).

Figure 12:
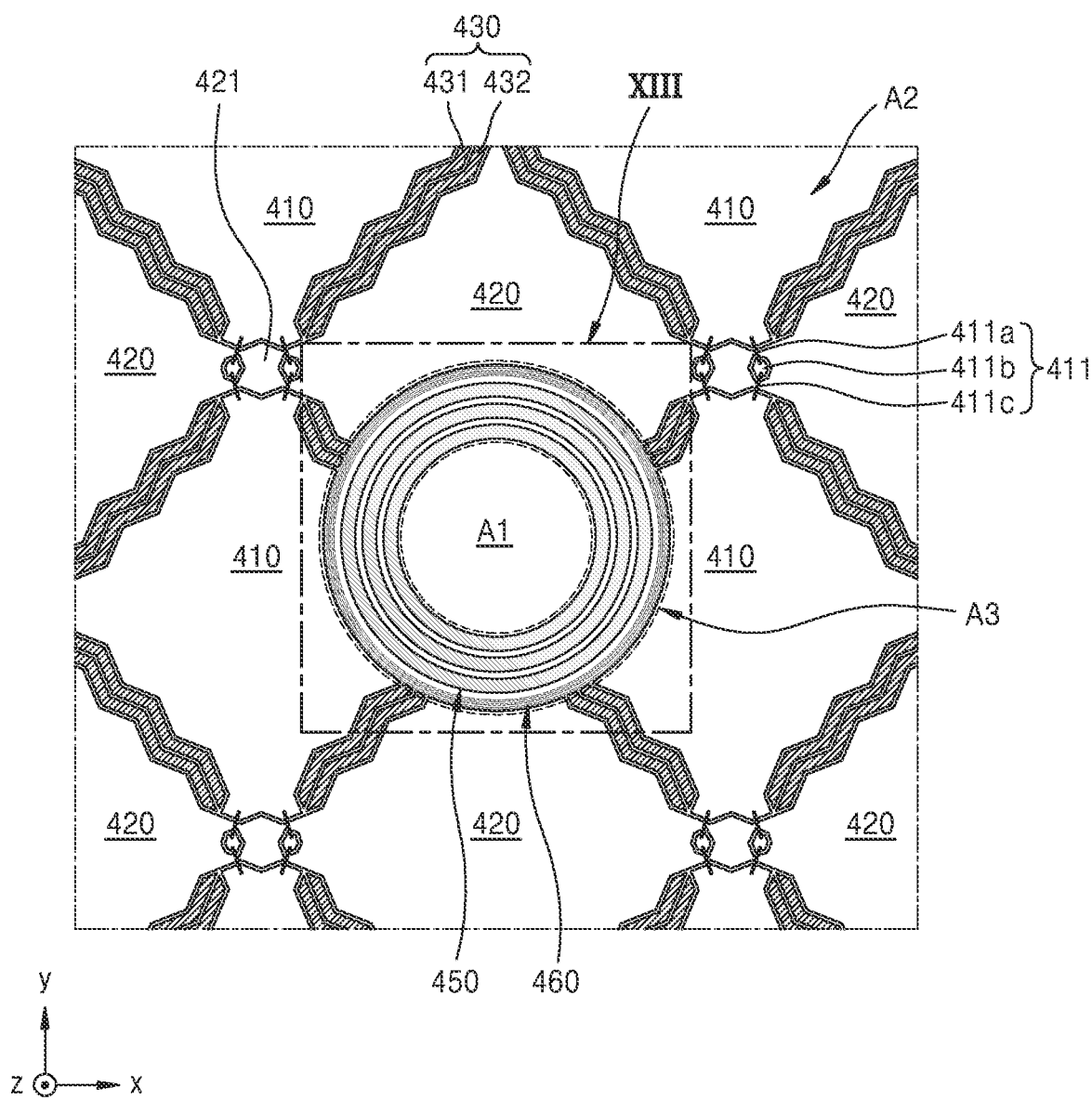
FIG. 12 is a plan view schematically illustrating a portion of a display apparatus according to an embodiment.

FIG. 12 is a plan view schematically illustrating a portion of a display apparatus according to an embodiment. FIG. 12 shows various elements arranged around the first area A1, for example, the first sensing electrode 410, the second sensing electrode 420, a dummy electrode 430, the shielding portion 450, and a metal wire 460.

Referring to FIG. 12, at (e.g., in or on) the second area A2, the first sensing electrodes 410 may be arranged along the ±y direction, and the second sensing electrodes 420 may be arranged along the ±x direction. The second sensing electrodes 420 that are adjacent to each other may be connected to each other via the second connection electrode 421 located therebetween. The first sensing electrodes 410 may be connected to each other via the first connection electrode 411, and the first connection electrode 411 may include an island portion 411b that is spaced apart from the first sensing electrode 410. The island portion 411b of the first connection electrode 411 may be arranged in a hole formed in the second connection electrode 421, and may be separated (e.g., may be spaced apart) from the second connection electrode 421 and electrically insulated from the second connection electrode 421.

One of the adjacent first sensing electrodes 410 may be connected to the island portion 411b via a first bridge portion 411a, and another one of the adjacent first sensing electrodes 410 may be connected to the island portion 411b via a second bridge portion 411c. The first connection electrode 411 may include a connection structure of the first bridge portion 411a, the island portion 411b, and the second bridge portion 411c. In an embodiment, the island portion 411b may be arranged at (e.g., in or on) the same layer as that of the first sensing electrodes 410, the second sensing electrodes 420, and the second connection electrodes 421. For example, the second conductive layer CML2 described above with reference to FIG. 9 may include the island portions 411b, the first sensing electrodes 410, the second sensing electrodes 420, and the second connection electrodes 421. On the other hand, the first bridge portions 411a and the second bridge portions 411c may be arranged at (e.g., in or on) a layer different from a layer at (e.g., in or on) which the island portions 411b are arranged. For example, the first conductive layer CML1 described above with reference to FIG. 9 may include the first bridge portions 411a and the second bridge portions 411c.

A dummy electrode 430 may be arranged between the first sensing electrode 410 and the second sensing electrode 420 that are adjacent to each other. For example, as shown in FIG. 12, the dummy electrode 430 may include a first dummy electrode 431 and a second dummy electrode 432, each extending along an edge of the first sensing electrode 410 or the second sensing electrode 420. For example, the first dummy electrode 431 and the second dummy electrode 432 may extend to have a zigzag shape. The dummy electrode 430 may improve a sensing sensitivity. The dummy electrode 430 may include a floating electrode.

Shapes of the first sensing electrodes 410 and the second sensing electrodes 420 that are arranged around (e.g., to be adjacent to) the first area A1 may be different from those of other sensing electrodes. Areas of the first sensing electrodes 410 and the second sensing electrodes 420 that are arranged around (e.g., to be adjacent to) the first area A1 may be less than those of the other sensing electrodes.

Each of the first sensing electrodes 410 and the second sensing electrodes 420 that are adjacent to the first area A1 may include a rounded edge, and an arrangement of the rounded edge of each of the first sensing electrode 410 and the second sensing electrode 420 may enclose (e.g., may surround around a periphery of) the first area A1 and the third area A3.

A plurality of shielding portions 450 may be arranged at (e.g., in or on) the third area A3. The plurality of shielding portions 450 may each have a suitable width, and may surround (e.g., around a periphery of) the first area A1. For example, each of the plurality of shielding portions 450 may have a ring shape surrounding (e.g., around a periphery of) the first area A1 in a plan view.

Each of the plurality of shielding portions 450 may include a conductive material. In an embodiment, the plurality of shielding portions 450 may include Mo, Mb, Ag, Ti, Cu, Al, and/or any suitable alloys thereof.

The plurality of shielding portions 450 may not be electrically connected to the surrounding elements, for example, to the first and second sensing electrodes 410 and 420 and the dummy electrode 430, and may be in a floating state (e.g., may be electrically floated). In other words, the plurality of shielding portions 450 may be electrically isolated. Accordingly, external static electricity (ESD) may be prevented or substantially prevented from flowing into the sensing electrodes through the plurality of shielding portions 450.

As described above with reference to FIG. 6, various lines, for example, a part of the data line DL and/or a part of the scan line SL, may be arranged at (e.g., in or on) the third area A3. The second area A2 is a display area at (e.g., in or on) which the pixels are arranged to implement an image, whereas the third area A3 is a non-display area at (e.g., in or on) which no pixels are arranged. Thus, the lines at (e.g., in or on) the third area A3 may be visually recognized by the user. To reduce or minimize the visual recognition of the lines arranged at (e.g., in or on) the third area A3, the plurality of shielding portions 450 may be arranged at (e.g., in or on) the third area A3. The plurality of shielding portions 450 may be arranged on the lines of the third area A3, thereby preventing or substantially preventing the lines from being visually recognized by a user.

A plurality of metal wires 460 may be arranged at (e.g., in or on) the third area A3. The plurality of metal wires 460 may be spaced apart from the plurality of shielding portions 450, and may be arranged outside of the plurality of shielding portions 450 to enclose (e.g., to surround around a periphery of) the plurality of shielding portions 450.

The plurality of metal wires 460 may have a suitable width (e.g., a predetermined or certain width), which may be equal to or substantially equal to at least 4 μm. For example, a width of each of the plurality of metal wires 460 may be the same or substantially the same as (e.g., may be equal to or substantially equal to) a width of each of the plurality of shielding portions 450. As another example, the width of each of the plurality of metal wires 460 may be different from the width of each of the plurality of shielding portions 450. Hereinafter, for convenience of description and illustration, a case where the width of each of the plurality of metal wires 460 is less than the width of each of the plurality of shielding portions 450 will be described in more detail.

Each of the plurality of metal wires 460 may include a conductive material. In an embodiment, the plurality of metal wires 460 may include Mo, Mb, Ag, Ti, Cu, A1, and/or any suitable alloys thereof.

Figure 13:
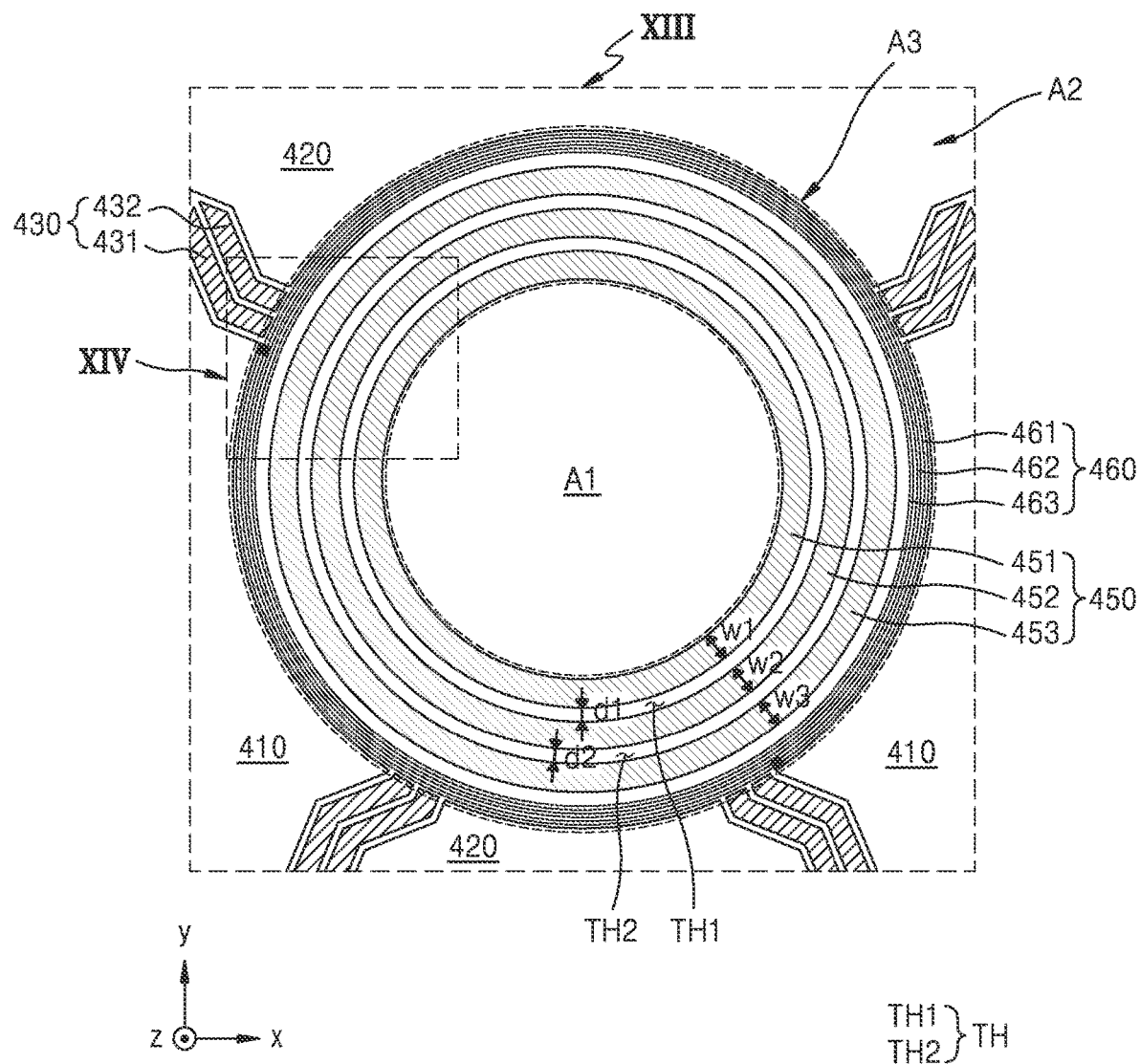
FIG. 13 is an enlarged plan view schematically illustrating the region XIII of the display apparatus of FIG. 12, according to an embodiment.

FIG. 13 is an enlarged plan view schematically illustrating the region XIII of the display apparatus of FIG. 12, according to an embodiment.

Referring to FIG. 13, the plurality of shielding portions 450 may each surround (e.g., around a periphery of) the first area A1, and may be arranged along an outer direction away from the first area A1. For example, the plurality of shielding portions 450 may include first to third shielding portions 451, 452, and 453, each surrounding (e.g., around a periphery of) the first area A1. The first shielding portion 451 may be arranged to be closest to the first area A1, the second shielding portion 452 may be arranged outside the first shielding portion 451, and the third shielding portion 453 may be arranged outside the second shielding portion 452.

Each of the plurality of shielding portions 450 may form a closed curve. For example, as shown in FIG. 13, when the first area A1 has a circular shape in a plan view, each of the first to third shielding portions 451, 452, and 453 may form a circular closed curve surrounding (e.g., around a periphery of) the first area A1 in the plan view. As another example, when the first area A1 has a rectangular shape in a plan view, each of the first to third shielding portions 451, 452, and 453 may form a rectangular closed curve in the plan view.

Each of the plurality of shielding portions 450 may have a suitable width. For example, the first to third shielding portions 451, 452, and 453 may have first to third widths w1, w2, and w3, respectively. As used herein, the width of each of the shielding portions 450 may be defined as a shortest distance between edges of opposite sides of the corresponding shielding portion 450. For example, each of the plurality of shielding portions 450 may include an inner edge facing the first area A1, and an outer edge opposite to the inner edge. The shortest distance between the inner edge and the outer edge may be defined as the width of the corresponding shielding portion 450. Here, the shortest distance may correspond to a distance in the outer direction away from the first area A1. In an embodiment, the widths w1, w2, and w3 of the plurality of shielding portions 450 may be the same or substantially the same as (e.g., may be equal to or substantially equal to) each other, for example, as shown in FIG. 13, the first to third widths w1, w2, and w3 may be the same or substantially the same as (e.g., may be equal to or substantially equal to) each other. For example, each of the first to third widths w1, w2, and w3 may be equal to or substantially equal to at least 4 μm.

The plurality of shielding portions 450 may be spaced apart from one another, and a gap may be formed between adjacent ones of the shielding portions 450. Here, the gap may be defined as a shortest distance in the outer direction between the adjacent ones of the shielding portions 450. For example, the first shielding portion 451 and the second shielding portion 452 may be spaced apart from each other by a first gap d1 therebetween, and the second shielding portion 452 and the third shielding portion 453 may be spaced apart from each other by a second gap d2 therebetween. In an embodiment, the gaps d1 and d2 between the plurality of shielding portions 450 may be the same or substantially the same as each other, and as shown in FIG. 13, the first gap d1 and the second gap d2 may be the same or substantially the same as (e.g., may be equal to or substantially equal to) each other. For example, each of the first and second gaps d1 and d2 may be equal to or substantially equal to at least 4 μm.

As the adjacent shielding portions 450 are spaced apart from each other, a through portion TH may be formed therebetween. For example, the first shielding portion 451 and the second shielding portion 452 may be spaced apart from each other, and a first through portion TH1 may be formed therebetween. Similarly, the second shielding portion 452 and the third shielding portion 453 may be spaced apart from each other, and a second through portion TH2 may be formed therebetween.

The plurality of metal wires 460 that are arranged outside the plurality of shielding portions 450 may be spaced apart from one another. In an embodiment, the plurality of metal wires 460 may include first to third metal wires 461, 462, and 463 that are spaced apart from one another. The first metal wire 461 may be arranged at (e.g., in or on) the outermost side of the plurality of metal wires 460, and the second metal wire 462 and the third metal wire 463 may be arranged between the first metal wire 461 and the plurality of shielding portions 450 in a plan view.

While FIG. 13 shows that three shielding portions 450 and three metal wires 460 are provided, the present disclosure is not limited thereto. As another example, each of the shielding portions 450 and the metal wires 460 may be provided in two, four, or more.

Figure 14:
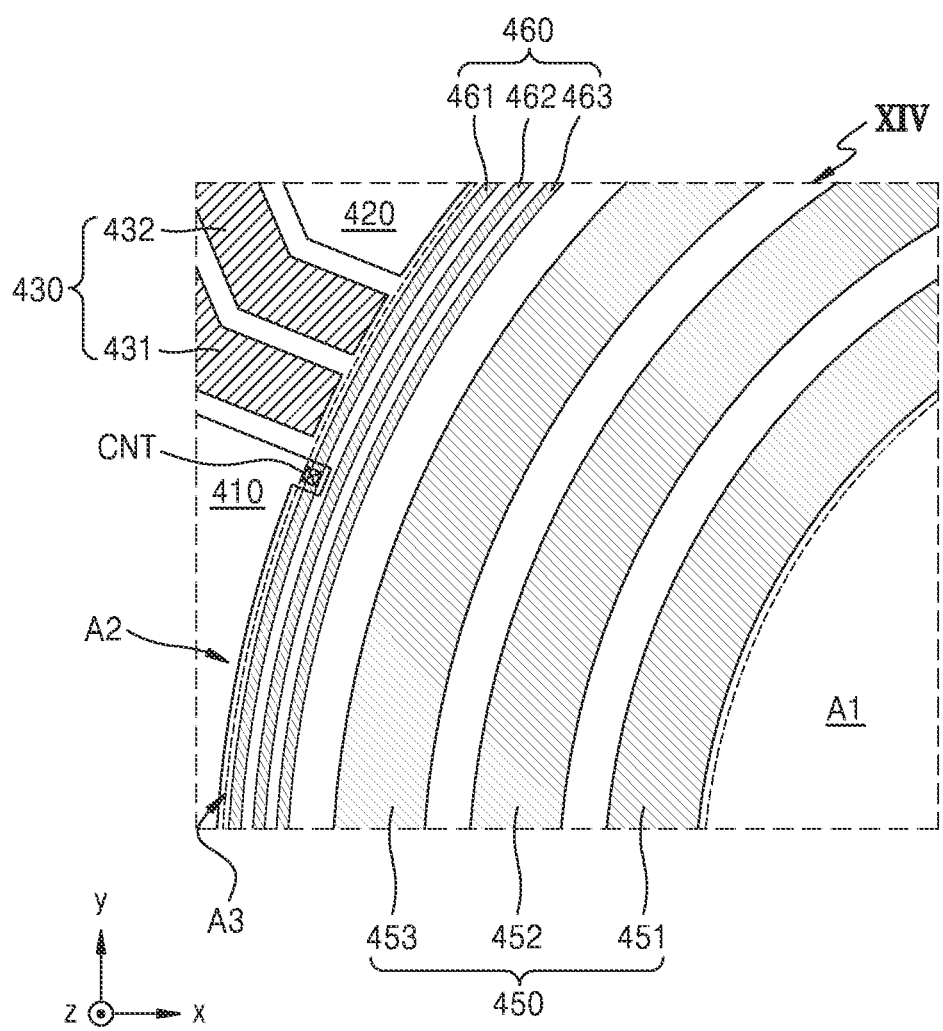
FIG. 14 is an enlarged plan view schematically illustrating the region XIV of the display apparatus of FIG. 13, according to an embodiment.

FIG. 14 is an enlarged plan view schematically illustrating the region XIV of the display apparatus of FIG. 13, according to an embodiment.

Referring to FIG. 14, the first metal wire 461 arranged at (e.g., in or on) the outermost side of the metal wires 460 from among the plurality of metal wires 460 may be electrically connected to one of the sensing electrodes of the input sensing section 40 (e.g., see FIG. 8). For example, the first metal wire 461 may be electrically connected to the first sensing electrode 410 or the second sensing electrode 420.

In an embodiment, FIG. 14 shows a case in which the first metal wire 461 is electrically connected to the first sensing electrode 410. In this case, the first metal wire 461 may not be electrically connected to the second sensing electrode 420. The first sensing electrode 410 and the second sensing electrode 420 may be insulated from each other. In other words, the first metal wire 461 may be selectively connected to one (e.g., to only one) of the first sensing electrode 410 or the second sensing electrode 420. For convenience of explanation and illustration, a case in which the first metal wire 461 is electrically connected to the first sensing electrode 410 will be described in more detail below.

The first sensing electrode 410 that is adjacent to the first metal wire 461 may include a protruding portion that overlaps with a portion of the first metal wire 461. A contact hole CNT may be located in an area where the portion of the first metal wire 461 and the protruding portion of the first sensing electrode 410 overlap with each other, and the first metal wire 461 and the first sensing electrode 410 may be electrically connected to each other via the contact hole CNT.

As described above, the first area A1 is an area where the components are arranged, and unlike at (e.g., in or on) the second area A2, a sensing electrode may not be arranged at (e.g., in or on) the first area A1. Thus, the sensing sensitivity may decrease at (e.g., in or on) an area from among the second area A2 that is adjacent to the first area A1. However, according to an embodiment, the first metal wire 461 may be electrically connected to the first sensing electrode 410, and thus, may function as a sensing electrode. The first metal wire 461 may be arranged at (e.g., in or on) the third area A3 between the first area A1 and the second area A2, and thus, a decrease in a sensing sensitivity at (e.g., in or on) the area adjacent to the first area A1 may be reduced.

Unlike the first metal wire 461, the second and third metal wires 462 and 463 that are arranged between the first metal wire 461 and the plurality of shielding portions 450 may be in a floating state, such that the second and third metal wires 462 and 463 are not electrically connected to the surrounding elements. In other words, the second and third metal wires 462 and 463 may be electrically isolated. The second and third metal wires 462 and 463 may prevent or substantially prevent the first and second sensing electrodes 410 and 420 of the input sensing section 40 from being damaged by static electricity (ESD) that may be introduced from the first area A1 through the plurality of shielding portions 450. For example, even if static electricity reaches the third metal wire 463, the third metal wire 463 is electrically isolated, and thus, the inflow (e.g., the transfer) of the static electricity to the sensing electrodes may be prevented or substantially prevented.

Figure 15:
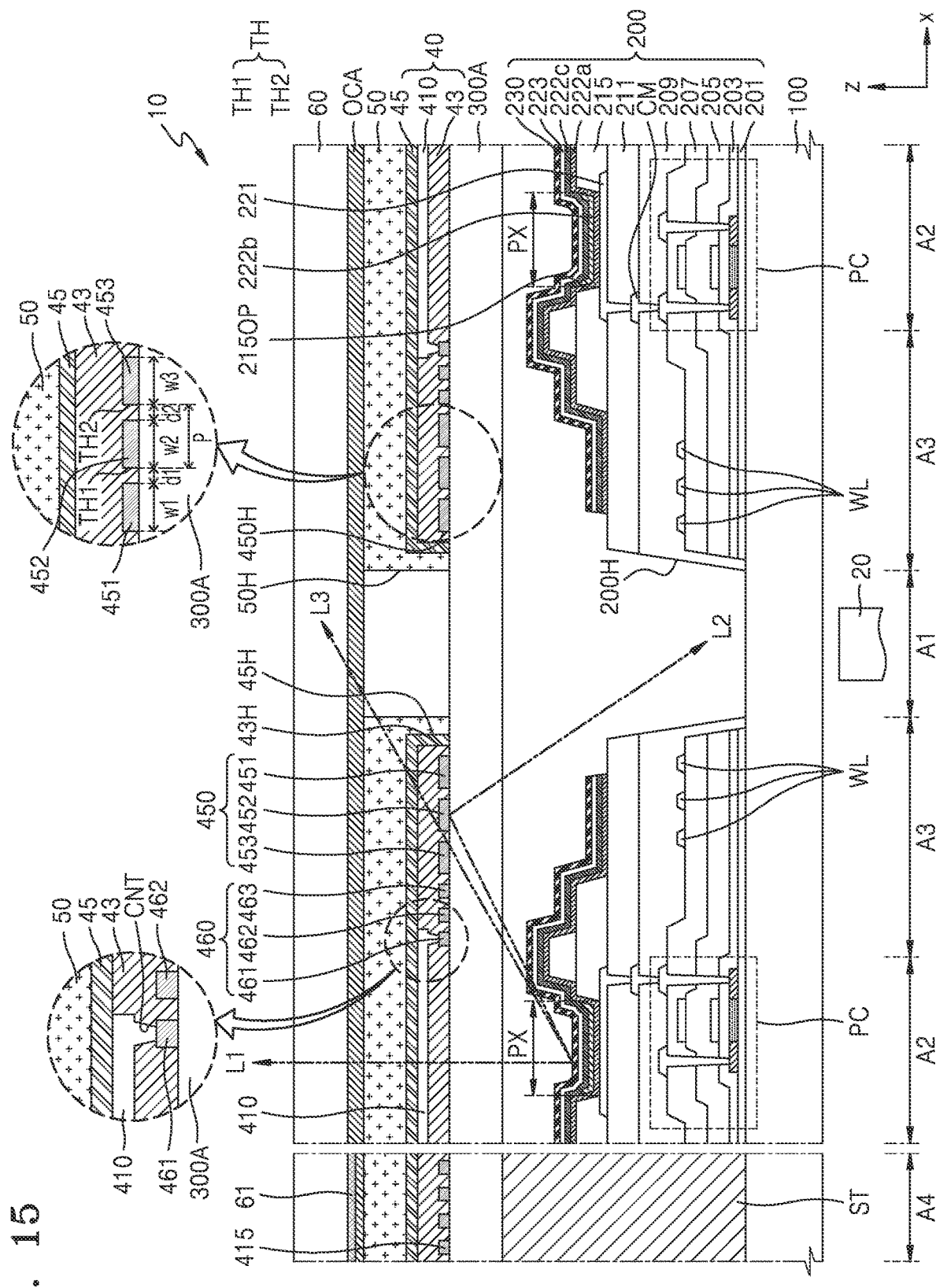
FIG. 15 is a cross-sectional view of a display panel according to an embodiment.

FIG. 15 is a cross-sectional view of the display panel 10 according to an embodiment. The same reference symbols are assigned to the elements shown in FIG. 15 to designate the same or substantially the same elements as those of one or more embodiments described above, such that redundant description thereof may not be repeated. FIG. 15 shows a structure of the display panel 10 to which the encapsulation substrate 300A described above with reference to FIG. 3A, and the input sensing section 40 described above with reference to FIGS. 10A and 10B are applied. Referring to FIG. 15, the display panel 10 may include the first to fourth areas A1, A2, A3, and A4, and thus, it may be understood that the substrate 100 of the display panel 10 may include the first to fourth areas A1, A2, A3, and A4.

The pixel circuit PC may be located at (e.g., in or on) the second area A2 on the substrate 100. The pixel circuit PC may include a plurality of thin-film transistors, and a storage capacitor. The semiconductor layer of a thin-film transistor may be arranged on the buffer layer 201, the gate electrode of the thin-film transistor and one electrode of the storage capacitor may be arranged on the gate insulating layer 203, another electrode of the storage capacitor may be arranged on the first interlayer insulating layer 205, the source and drain electrodes of the thin-film transistor may be arranged on the second interlayer insulating layer 207, the contact metal CM may be arranged on the first organic insulating layer 209, and the pixel electrode 221 may be arranged on the second organic insulating layer 211, which are arranged on the substrate 100.

The pixel electrode 221 may be connected to the contact metal CM via a contact hole in the second organic insulating layer 211, and the contact metal CM may be connected to the thin-film transistor of the pixel circuit PC via a contact hole in the first organic insulating layer 209. The pixel-defining layer 215 arranged on the pixel electrode 221 may include the opening 2150P overlapping with the pixel electrode 221, and the opening 2150P of the pixel-defining layer 215 may define an emission area, or in other words, the pixel PX. The first functional layer 222a, the emission layer 222b, the second functional layer 222c, and the capping layer 230 may be sequentially stacked on the pixel-defining layer 215. A stacked structure of the pixel electrode 221, the emission layer 222b, and the opposite electrode 223 arranged at (e.g., in or on) the second area A2 may be included in the light-emitting element.

The first area A1 may be located between the pixel circuits PC. The display layer 200 may include the third hole 200H at (e.g., in or on) the first area A1. The third hole 200H may be formed by overlapping through holes formed in each of the insulating layers of the display layer 200 with each other. The insulating layers of the display layer 200, for example, such as the buffer layer 201, the gate insulating layer 203, the first interlayer insulating layer 205, the second interlayer insulating layer 207, the first organic insulating layer 209, the second organic insulating layer 211, and the pixel-defining layer 215, may include through holes at (e.g., in or on) the first area A1, respectively, and the third hole 200H may be defined by an insulating layer having a through hole having the smallest size from among the insulating layers of the display layer 200 described above. In an embodiment, FIG. 15 shows that the third hole 200H is defined by side surfaces of the first organic insulating layer 209.

Like the insulating layers of the display layer 200, each of the first functional layer 222a, the second functional layer 222c, the opposite electrode 223, and the capping layer 230 may include a hole that is formed by removing a portion thereof corresponding to the first area A1.

Some of lines WL that are electrically connected to the pixel circuits PC may be located at (e.g., in or on) the third area A3. As described above, the lines WL may include a part of the data line DL and/or a part of the scan line SL (e.g., see FIG. 6). In an embodiment, the lines WL may be arranged on the second interlayer insulating layer 207 at (e.g., in or on) the third area A3.

An encapsulation member (e.g., 300A) may be arranged on the display layer 200. The encapsulation member may cover the elements of the display layer 200, for example, such as the pixel circuit PC. In an embodiment, FIG. 15 shows that the display panel 10 includes the encapsulation substrate 300A as the encapsulation member. The encapsulation substrate 300A may be arranged to face the substrate 100. The encapsulation substrate 300A may include the same or substantially the same material as that of the substrate 100, and may have the same or substantially the same refractive index as that of the substrate 100. For example, each of the substrate 100 and the encapsulation substrate 300A may have a refractive index of about 1.3 to about 1.7. In an embodiment, each of the substrate 100 and the encapsulation substrate 300A may have a refractive index of about 1.5.

A filler may be filled between the substrate 100 and the encapsulation substrate 300A. The filler that is arranged at (e.g., in or on) at least the first area A1 may have a refractive index that is equal to or substantially equal to that of the substrate 100 and the encapsulation substrate 300A. In this case, when light is transmitted through the first area A1, the refraction of light may be reduced or minimized.

The plurality of shielding portions 450 may be arranged at (e.g., in or on) the third area A3, and may overlap with at least one of the lines WL arranged at (e.g., in or on) the third area A3. The plurality of shielding portions 450 may be spaced apart from one another. In addition, the plurality of metal wires 460 may also be arranged at (e.g., in or on) the third area A3, and spaced apart from one another.

The plurality of shielding portions 450 and the plurality of metal wires 460 may be arranged on the encapsulation member (e.g., the encapsulation substrate 300A). For example, the plurality of shielding portions 450 and the plurality of metal wires 460 may directly contact an upper surface of the encapsulation substrate 300A.

In an embodiment, the plurality of shielding portions 450 and the plurality of metal wires 460 may be formed in the same process as some of the processes of forming the input sensing section 40. For example, the plurality of shielding portions 450 and the plurality of metal wires 460 may be formed in the same process as the process of forming the first and second trace lines 415 and 425 (e.g., see FIG. 8) and the first connection electrode 411 (e.g., see FIG. 10A) of the input sensing section 40. In other words, the plurality of shielding portions 450, the plurality of metal wires 460, the first and second trace lines 415 and 425, and the first connection electrode 411 may be included in the first conductive layer CML1 (e.g., see FIG. 10A). In this regard, FIG. 15 shows an embodiment in which the first trace lines 415 located at (e.g., in or on) the fourth area A4, and the plurality of shielding portions 450 and the plurality of metal wires 460 located at (e.g., in or on) the third area A3 are directly arranged on the upper surface of the encapsulation substrate 300A. Each of the plurality of shielding portions 450, the plurality of metal wires 460, the first and second trace lines 415 and 425, and the first connection electrode 411 may include the same or substantially the same material as each other.

At least one of the first and second trace lines 415 and 425 located at (e.g., in or on) the fourth area A4, for example, such as the first trace lines 415, may overlap with the sealant ST.

The first insulating layer 43 may be arranged on the plurality of shielding portions 450 and the plurality of metal wires 460. The first and second sensing electrodes 410 and 420 (e.g., see FIGS. 10A and 10B), and the second insulating layer 45 may be sequentially arranged on the first insulating layer 43. FIG. 15 shows that the first sensing electrode 410 is arranged on the first insulating layer 43, and the second insulating layer 45 is arranged on the first sensing electrode 410.

Each of the first insulating layer 43 and the second insulating layer 45 may extend from the second area A2 to the third area A3, and may cover the plurality of shielding portions 450 and the plurality of metal wires 460. A portion of the first insulating layer 43 may be positioned between two adjacent shielding portions 450 that are adjacent to each other from among the plurality of shielding portions 450, and a portion of the first insulating layer 43 may be positioned between two metal wires 460 that are adjacent to each other from among the plurality of metal wires 460. Because of the first insulating layer 43, the plurality of shielding portions 450 may be insulated from each other, and the plurality of metal wires 460 may be insulated from each other. For example, some portions of the first insulating layer 43 may be located in the first through portion TH1 and in the second through portion TH2, and thus, the first to third shielding portions 451, 452, and 453 may be insulated from each other.

The first insulating layer 43 and the second insulating layer 45 may include a fourth hole 43H and a fifth hole 45H, respectively, each corresponding to the first area A1. An end portion of the first insulating layer 43 defining the fourth hole 43H may cover an inner edge of the first shielding portion 451, and an end portion of the second insulating layer 45 defining the fifth hole 45H may cover the end portion of the first insulating layer 43 described above.

The first insulating layer 43 and the second insulating layer 45 may include the same or substantially the same material as each other, or may include different materials from each other. Each of the first insulating layer 43 and the second insulating layer 45 may include an inorganic insulating material, for example, such as silicon nitride, silicon oxide, and/or silicon oxynitride.

The contact hole CNT for electrically connecting the first sensing electrode 410 and the first metal wire 461 to each other may be formed in the first insulating layer 43.

The optical functional section 50 may be arranged on the input sensing section 40, and may have the second hole 50H corresponding to the first area A1. An optical clear adhesive (OCA) and the window 60 may be arranged on the optical functional section 50. A light-shielding portion 61 may be arranged on a rear surface of the window 60 to cover the elements arranged at (e.g., in or on) the fourth area A4, for example, such as the first trace lines 415 or the like. The light-shielding portion 61 that covers a dead area may include a colored layer. For example, the light-shielding portion 61 may include one or more layers of various suitable colors, for example, such as white, black, silver, gold, and/or pink. The light-shielding portion 61 may have a polygonal ring shape or a polygonal frame shape surrounding (e.g., around a periphery of) the second area A2 in a plan view. For example, the light-shielding portion 61 may have a rectangular or substantially rectangular ring shape or a rectangular or substantially rectangular frame shape in a plan view.

The light emitted by the pixel PX may generally travel in the +z direction. However, some of the light emitted by the pixel PX may travel obliquely at an angle to the +z direction. In this regard, FIG. 15 shows optical paths of first to third lights L1, L2, and L3 that are emitted by the pixel PX adjacent to the first area A1 from among the pixels PX arranged at (e.g., in or on) the second area A2.

The first light L1 may travel in the +z direction. However, the second light L2 may be emitted obliquely with respect to the +z direction, and may proceed toward the shielding portion 450. The second light L2 may be reflected from a lower surface of the shielding portion 450, and may be incident on the component 20 at (e.g., in or on) the first area A1. The second light L2 that is incident on the component 20 may act as noise, and thus, may be a factor that deteriorates the performance of the component 20.

According to an embodiment, the plurality of shielding portions 450 are spaced apart from each other, and the through portion TH may be formed between the plurality of shielding portions 450. Thus, like the third light L3 shown in FIG. 15, some of the light emitted by the pixel PX and traveling toward the plurality of shielding portions 450 may pass through the through portion TH instead of being reflected from the lower surfaces of the shielding portions 450. Thus, the reflectance by the plurality of shielding portions 450 may be decreased. In this case, an amount of the light reflected from the lower surfaces of the plurality of shielding portions 450 and incident on the component 20 may be decreased, and thus, the performance degradation of the component 20 may be prevented or reduced.

As a comparative example, a single shielding portion that overlaps with the lines WL located at (e.g., in or on) the third area A3 overall, and that is integrally formed may be provided. In other words, the shielding portion of the comparative example may not include the through portion TH. In this case, the lines WL may be prevented or substantially prevented (e.g., may be completely prevented) from being visually recognized by the user, but the reflectance by the shielding portion may not be reduced, and thus, may not prevent or reduce the performance degradation of the component 20.

However, according to one or more embodiments as described above, the plurality of shielding portions 450 overlap with the lines WL, and the through portions TH may be formed by spacing the plurality of shielding portions 450 from each other, to thereby prevent or substantially prevent the lines WL from being visually recognized by the user, and also to reduce the reflectance from the shielding portion 450. Thus, the performance degradation of the component 20 may be prevented or reduced.

When the plurality of shielding portions 450 have the same or substantially the same width as each other, and are arranged at the same or substantially the same interval from each other, the sum of the width and the interval may be defined as a pitch P. The plurality of shielding portions 450 may be repeatedly arranged in a pitch P cycle. For example, the sum of the first width w1 and the first gap d1 may be equal to or substantially equal to the sum of the second width w2 and the second gap d2, and the sum may define the pitch P. In an embodiment, the pitch P may have a value of about 6 um to about 150 um.

According to an embodiment, a ratio of the width to the pitch P may be 0.1 to 0.9. For example, a ratio of the first width w1 to the pitch P may be 0.1 to 0.9. In a case where the plurality of shielding portions 450 have the same or substantially the same pitch P as each other, the interval between the plurality of shielding portions 450 may decrease as the width of each of the shielding portions 450 increases, and thus, the above described ratio may decrease. Conversely, the width of each of the shielding portions 450 may increase as the interval between the plurality of shielding portions 450 decreases, and thus, the above described ratio may increase.

When designing the display panel 10, the ratio may be suitably adjusted according to the purpose of the display panel 10. For example, in order to increase the performance improvement effect of the component 20, the ratio may be lowered. Conversely, in order to increase the effect of improving the visibility of the lines WL, the ratio may be increased.

Figure 16:
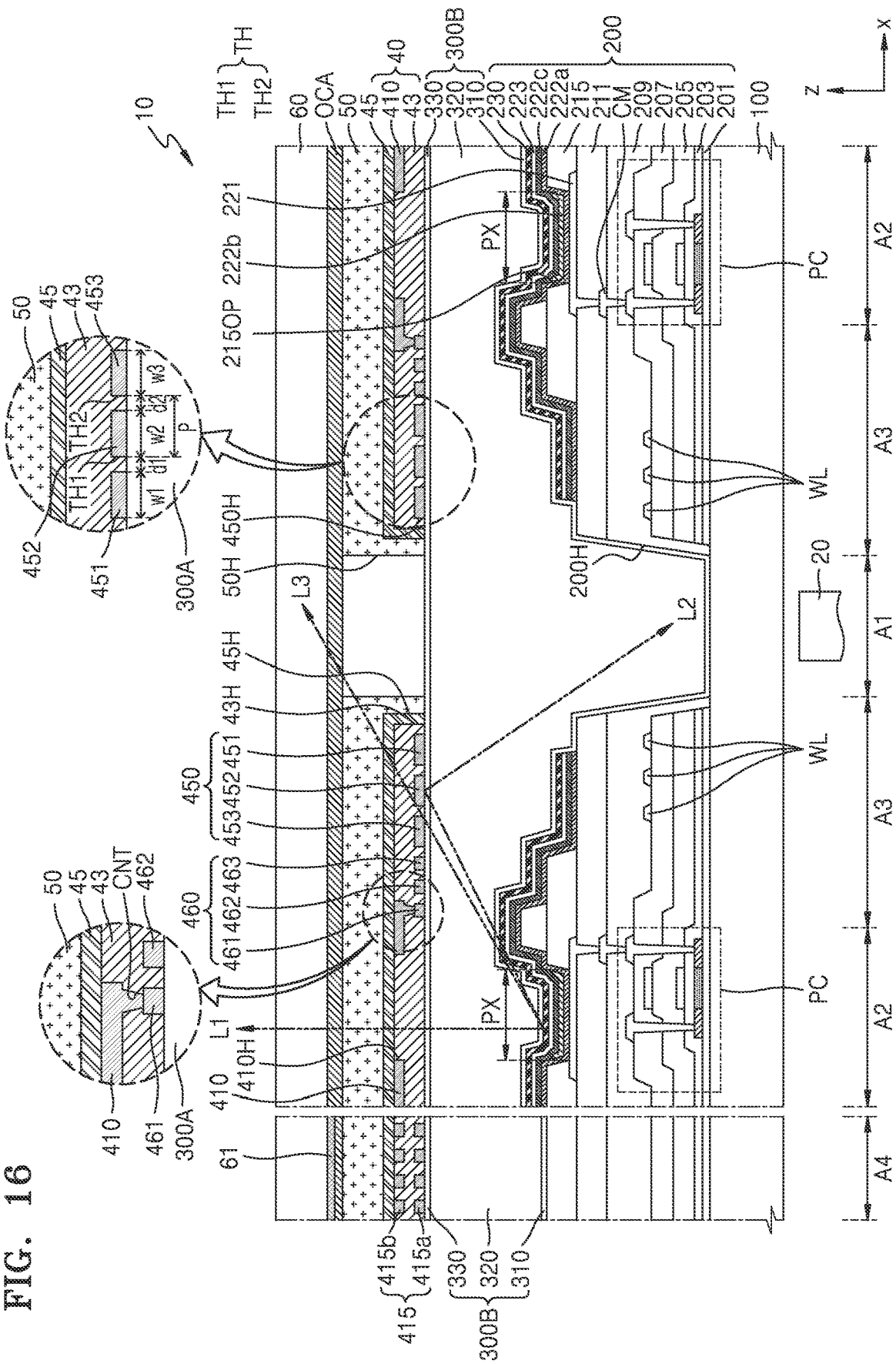
FIG. 16 is a cross-sectional view of a display panel according to another embodiment.

FIG. 16 is a cross-sectional view of the display panel 10 according to another embodiment. Redundant description of the elements that are the same or substantially the same as or corresponding to those described above with reference to FIG. 15 may not be repeated, and the differences therebetween will be mainly described in more detail below. FIG. 16 shows a structure of the display panel 10 to which the encapsulation layer 300B described above with reference to FIG. 3B, and the input sensing section 40 described above with reference to FIGS. 11A and 11B are applied.

Referring to FIG. 16, the encapsulation layer 300B may be arranged on the display layer 200 as the encapsulation member. As described above with reference to FIG. 3B, the encapsulation layer 300B may include at least one inorganic encapsulation layer and at least one organic encapsulation layer. In an embodiment, the encapsulation layer 300B of FIG. 16 may include the first and second inorganic encapsulation layers 310 and 330, and the organic encapsulation layer 320 therebetween.

The plurality of shielding portions 450 and the plurality of metal wires 460 may be arranged on the encapsulation layer 300B, and may each directly contact an upper surface of the second inorganic encapsulation layer 330, for example.

The plurality of shielding portions 450 and the plurality of metal wires 460 may be formed in the same process as the process of forming a portion 415a of the first trace lines 415 (e.g., see FIG. 8) and the first connection electrode 411 (e.g., see FIG. 11A) of the input sensing section 40. In other words, the plurality of shielding portions 450, the plurality of metal wires 460, the portion 415a of the first trace lines 415, and the first connection electrode 411 may be included in the first conductive layer CML1 (e.g., see FIG. 11A), and may have the same or substantially the same material as each other.

The first insulating layer 43 may be arranged on the plurality of shielding portions 450 and the plurality of metal wires 460, and the first and second sensing electrodes 410 and 420 (e.g., see FIGS. 11A and 11B) and the second insulating layer 45 may be sequentially arranged on the first insulating layer 43. FIG. 16 shows that the first sensing electrode 410 is arranged on the first insulating layer 43, and the second insulating layer 45 is arranged on the first sensing electrode 410. In addition, another portion 415b of the first trace lines 415 may be arranged on the first insulating layer 43, and may include the same or substantially the same material as that of the first sensing electrode 410. In other words, the other portion 415b of the first trace lines 415 and the first sensing electrode 410 may be included in the second conductive layer CML2 (e.g., see FIG. 11B).

As described above, the mesh-shaped first sensing electrode 410 may have a hole 410H overlapping with the pixel PX, and the first light L1 emitted by the pixel PX may pass through the hole 410H of the first sensing electrode 410. The first sensing electrode 410 may be electrically connected to the first metal wire 461 via the contact hole CNT formed in the first insulating layer 43.

Figure 17A:
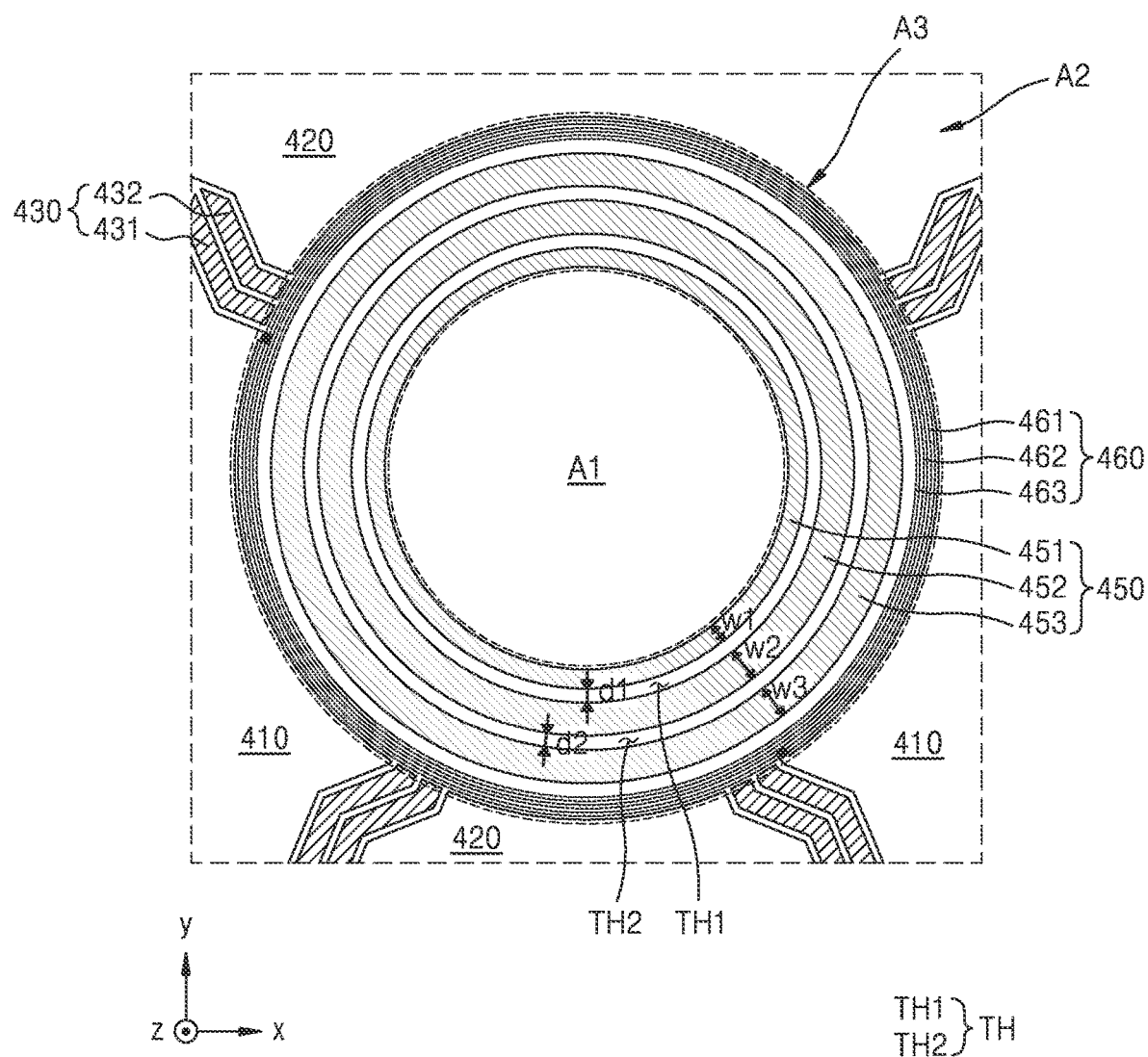
FIGS. 17A-17C are schematic plan views of a partially enlarged display apparatus, according to one or more embodiments.
Figure 17B:
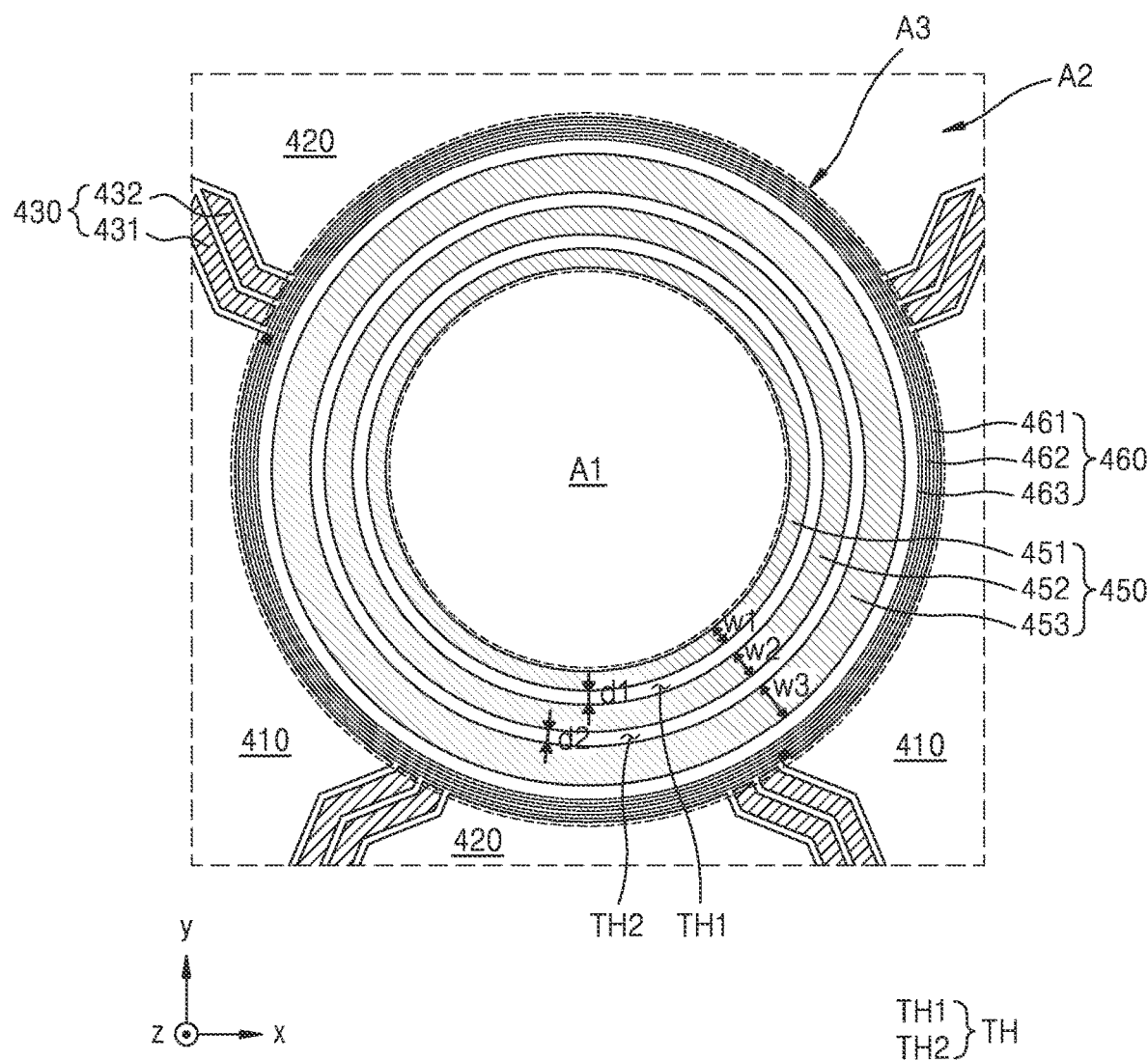
Figure 17C:
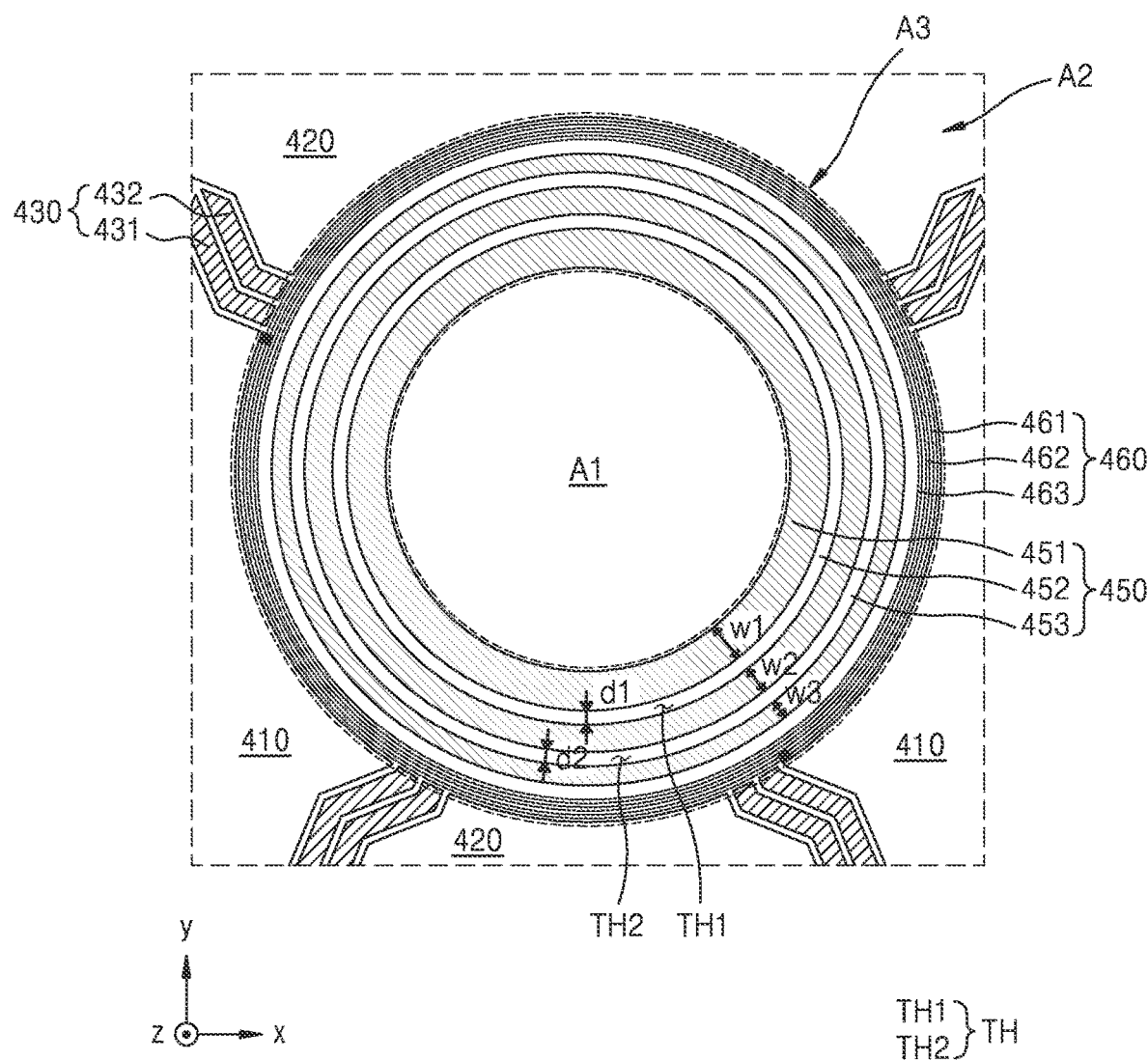

FIGS. 17A to 17C are schematic plan views of a partially enlarged portion of a display apparatus, according to one or more embodiments. Redundant description of the elements that are the same or substantially the same as or corresponding to those described above with reference to FIG. 13 may not be repeated, and the differences therebetween will be mainly described in more detail below.

Referring to FIG. 17A, at least two widths of the plurality of shielding portions 450 may be different from each other. Some of the widths of the plurality of shielding portions 450 may be different from each other, and other widths thereof may be the same or substantially the same as each other. For example, the first width w1 of the first shielding portion 451 may be different from the second width w2 of the second shielding portion 452, and the second width w2 of the second shielding portion 452 may be the same or substantially the same as the third width w3 of the third shielding portion 453. However, the present disclosure is not limited thereto, and the widths w1, w2, and w3 of the plurality of shielding portions 450 may be all be different from each other.

Referring to FIG. 17B, the widths w1, w2, and w3 of the plurality of shielding portions 450 may be different from each other. For example, the closer to the first area A1 that a shielding portion 450 is from among the plurality of shielding portions 450, the smaller the width thereof may be. As shown in FIG. 17B, for example, the first to third shielding portions 451, 452, and 453 that are sequentially arranged in an outer direction away from the first area A1 have the first to third widths w1, w2, and w3, respectively. The first width w1 may be less than the second width w2, and the second width w2 may be less than the third width w3.

Referring to FIG. 17C, the widths w1, w2, and w3 of the plurality of shielding portions 450 may be different from each other. For example, the closer to the first area A1 that a shielding portion 450 is from among the plurality of shielding portions 450, the greater the width thereof may be. As shown in FIG. 17C, for example, the first width w1 may be greater than the second width w2, and the second width w2 may be greater than the third width w3.

Positions of the through portions TH between the plurality of shielding portions 450 may be determined by the widths of the plurality of shielding portions 450. For example, the smaller the first width w1 of the first shielding portion 451 is, the closer to the first area A1 the first through portion TH1 may be. As in the various embodiments described above, the positions of the through portions TH may be adjusted by appropriately modifying and designing the widths of the plurality of shielding portions 450, while maintaining or substantially maintaining a constant interval between the plurality of shielding portions 450. For example, when the positions of the through portions TH are arranged so that light emitted by the pixels PX adjacent to the first area A1 passes through the through portion TH as much as possible, the effect of improving the performance of the components may be enhanced without increasing the area of the through portion TH.

Figure 18A:
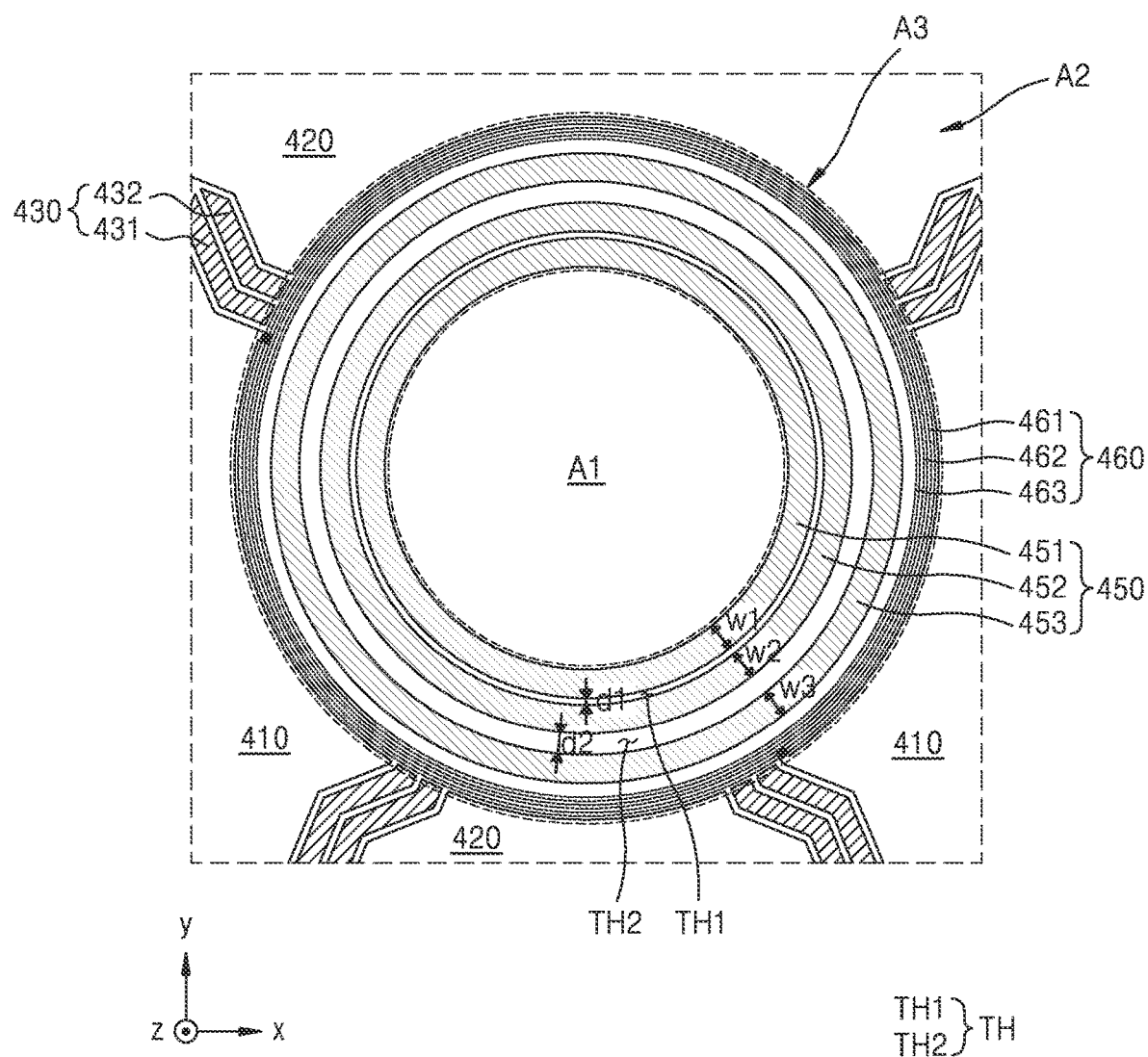
FIGS. 18A-18B are schematic plan views of a partially enlarged display apparatus, according to one or more embodiments.
Figure 18B:
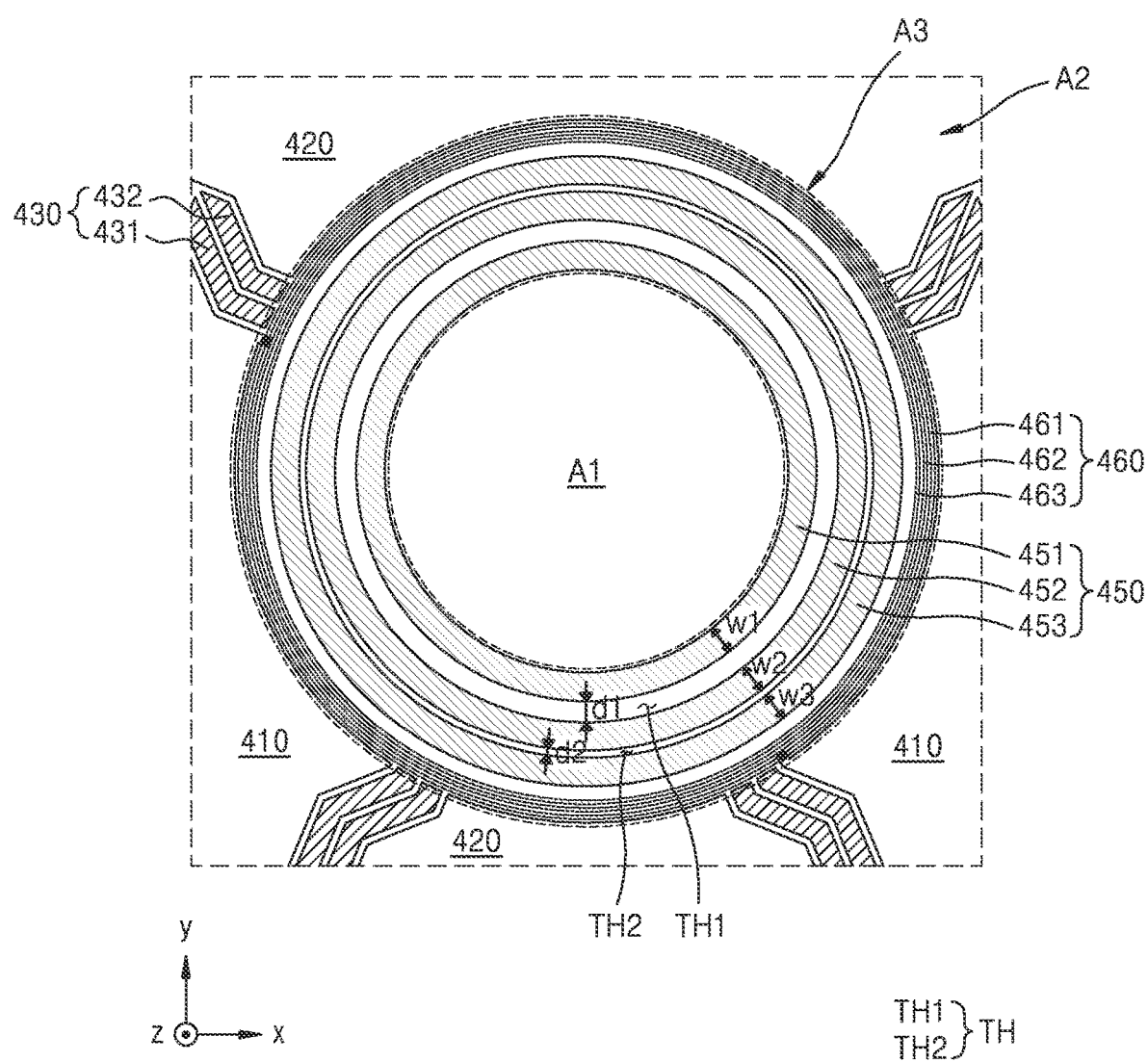

FIGS. 18A and 18B are schematic plan views of a partially enlarged portion of a display apparatus, according to one or more embodiments. Redundant description of the elements that are the same or substantially the same as or corresponding to those described above with reference to FIG. 12 may not be repeated, and the differences therebetween will be mainly described in more detail below.

Referring to FIGS. 18A and 18B, the intervals between the plurality of shielding portions 450 may be different from each other. For example, the first gap d1 between the first shielding portion 451 and the second shielding portion 452 may be different from the second gap d2 between the second shielding portion 452 and the third shielding portion 453. In an embodiment, as shown in FIG. 18A, the interval between the shielding portions 450 may increase as the distance of a shielding portion 450 from the first area A1 increases. In another embodiment, as shown in FIG. 18B, the interval between the shielding portions 450 may decrease as the distance of a shielding portion 450 from the first area A1 increases.

Although FIGS. 18A and 18B show that three shielding portions 450 are provided, and two intervals d1 and d2 are formed therebetween, the present disclosure is not limited thereto. For example, four or more shielding portions 450 may be provided, and three or more intervals may be formed therebetween. In this case, some of the three or more intervals may be different from each other, and other ones thereof may be the same or substantially the same as each other. However, the present disclosure is not limited thereto, and all three or more intervals may be different from each other.

Figure 19A:
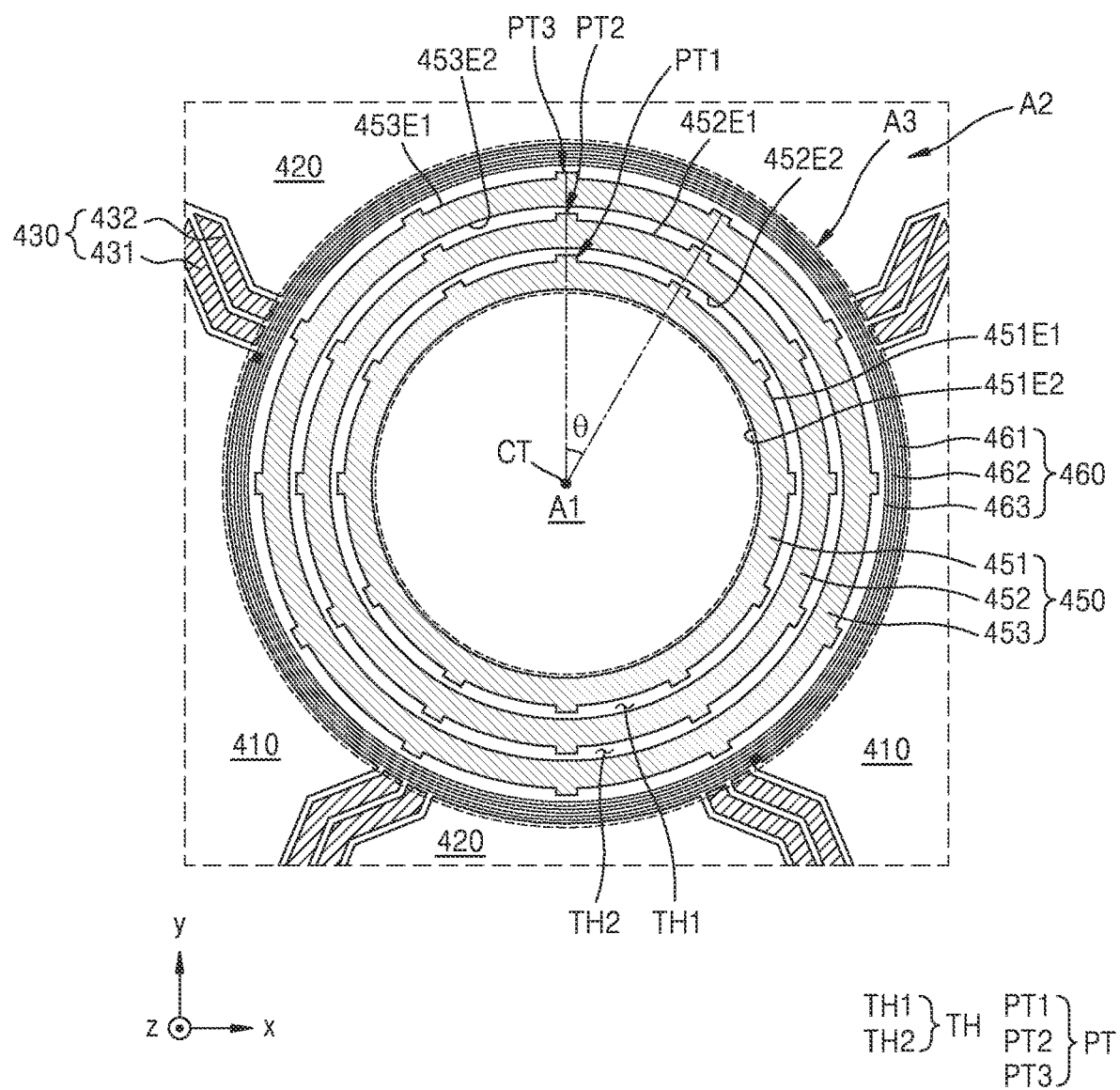
FIGS. 19A-19C are schematic plan views of a partially enlarged display apparatus, according to one or more embodiments.
Figure 19B:
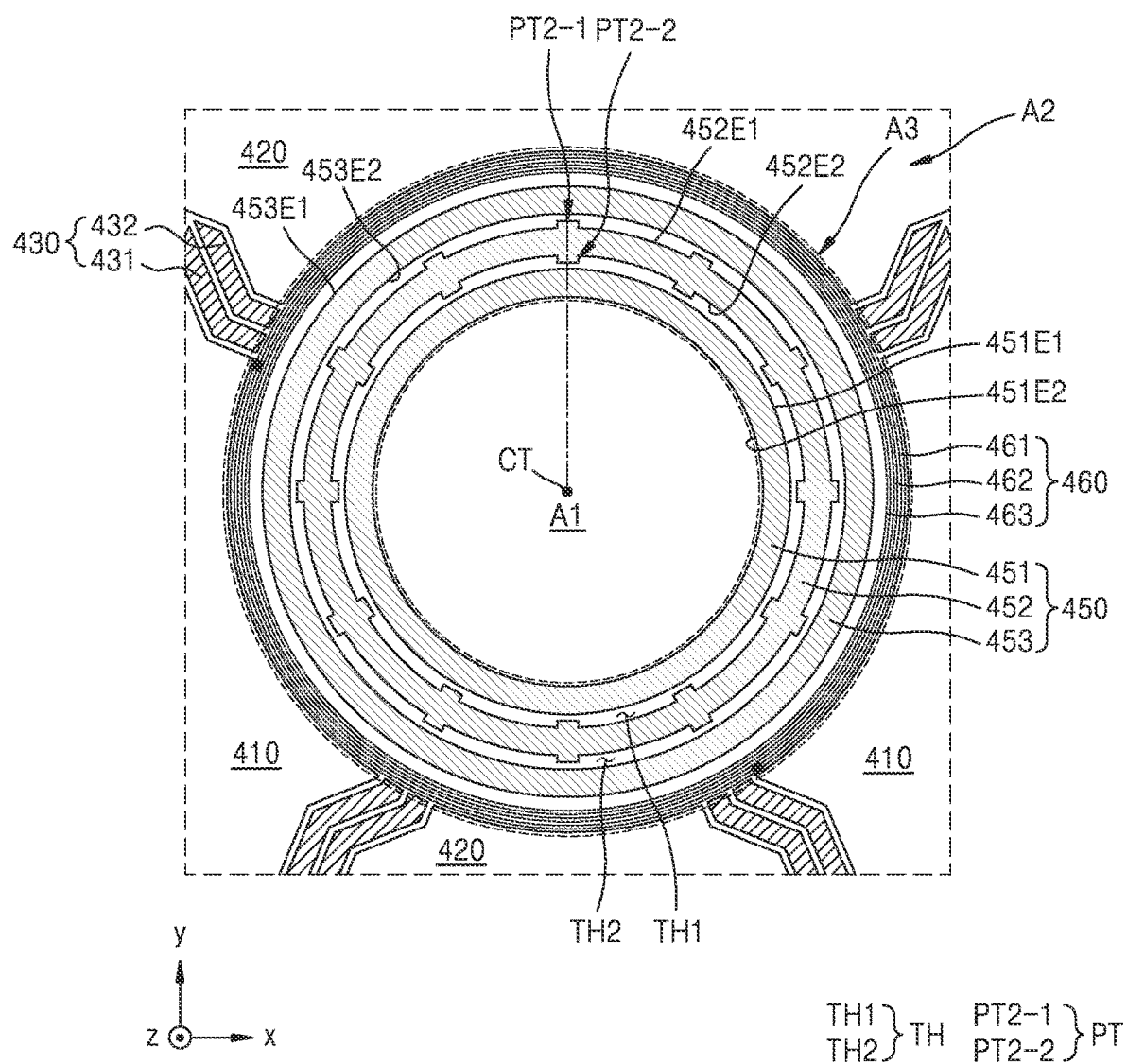
Figure 19C:
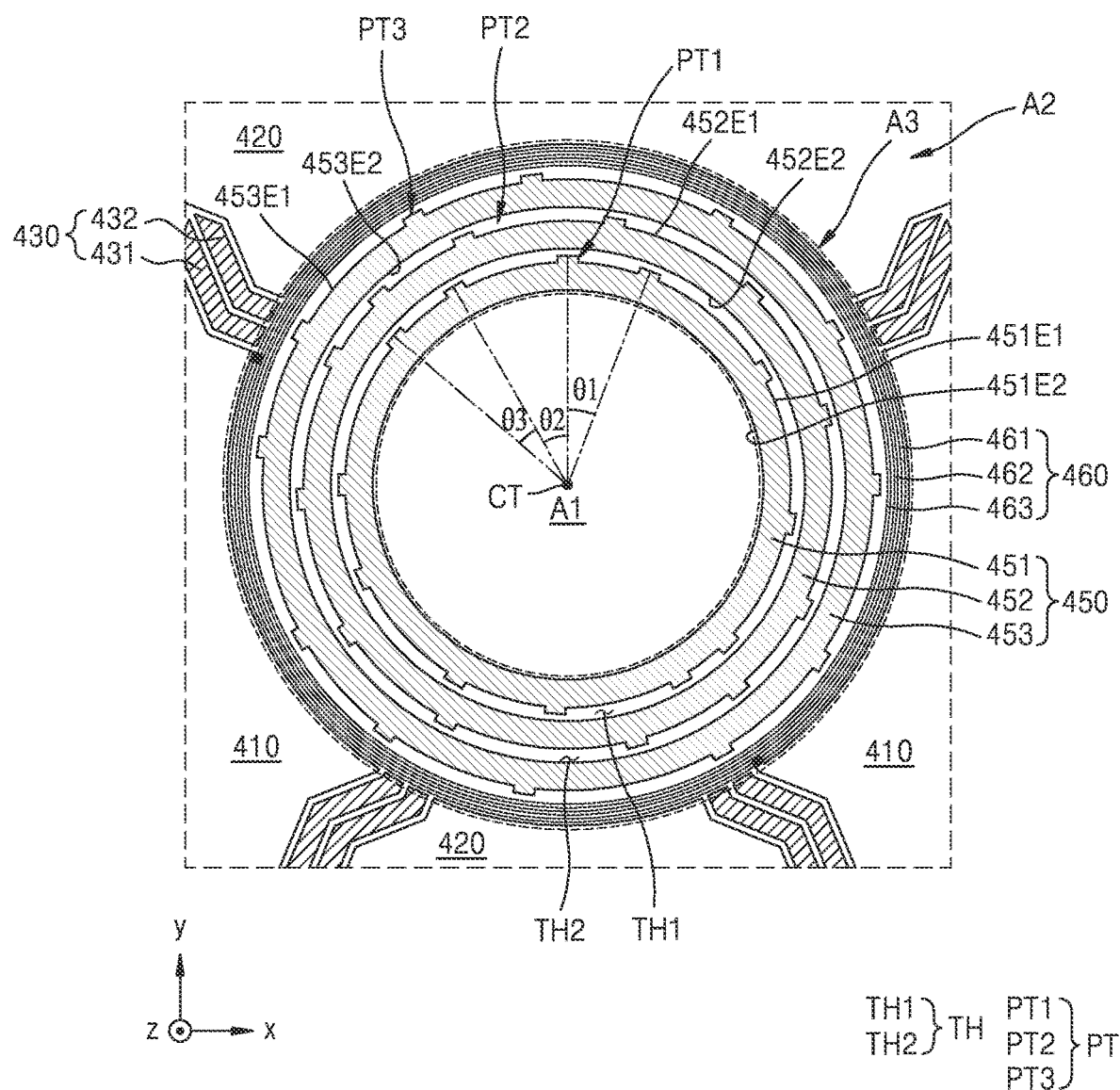

FIGS. 19A to 19C are schematic plan views of a partially enlarged portion of a display apparatus, according to one or more embodiments. Redundant description of the elements that are the same or substantially the same as or corresponding to those described above with reference to FIG. 13 may not be repeated, and the differences therebetween will be mainly described in more detail below.

Referring to FIG. 19A, each of the plurality of shielding portions 450 may include an outer edge facing an outer direction, and an inner edge opposite to the outer edge facing the first area A1. Here, the outer direction may be defined as a direction away from the first area A1.

In an embodiment, at least one of the outer edge and the inner edge of the shielding portion 450 may include a plurality of protruding portions PT. Each of the plurality of protruding portions PT may protrude from the corresponding shielding portion 450 toward an adjacent shielding portion 450, or toward the metal wire 460.

For example, an outer edge 451 E1 of the first shielding portion 451 may include a plurality of first protruding portions PT1, and the first protruding portions PT1 may protrude from the outer edge 451 E1 of the first shielding portion 451 toward the second shielding portion 452. Similarly, an outer edge 452E1 of the second shielding portion 452 may include a plurality of second protruding portions PT2, and the second protruding portions PT2 may protrude from the outer edge 452E1 of the second shielding portion 452 toward the third shielding portion 453. An outer edge 453E1 of the third shielding portion 453 may include a plurality of third protruding portions PT3, and the third protruding portions PT3 may protrude from the outer edge 453E1 of the third shielding portion 453 toward the metal wires 460.

Each of the plurality of protruding portions PT may have a shape of a part of a polygon, a part of a circle, or a part of an ellipse on a plane (e.g., in a plan view). FIG. 19A shows that each of the plurality of protruding portions PT has a rectangular shape or a partial rectangular shape on a plane (e.g., in a plan view) as an example, but the present disclosure is not limited thereto.

In an embodiment, the plurality of protruding portions PT may be arranged at equal or substantially equal intervals along the corresponding edge of the corresponding shielding portion 450. For example, the first protruding portions PT1 are arranged along the outer edge 451 E1 of the first shielding portion 451, and a central angle θ formed by two adjacent ones of the first protruding portions PT1 may be the same or substantially the same as a central angle θ formed by another two adjacent ones of the first protruding portions PT1. Here, the central angle θ may be defined as an acute angle between virtual lines connecting a center CT of the first area A1 to two adjacent protruding portions PT. Similarly, the second protruding portions PT2 arranged along the outer edge 452E1 of the second shielding portion 452 and the plurality of third protruding portions PT3 arranged along the outer edge 453E1 of the third shielding portion 453 may also be arranged at equal or substantially equal intervals.

FIG. 19A shows that the number of each of the first to third protruding portions PT1, PT2, and PT3 is provided in 12, and that the central angle θ is 30°, but the present disclosure is not limited thereto. As long as each of the first to third protruding portions PT1, PT2, and PT3 are arranged at equal or substantially equal intervals, there is no limitation on the number of the first to third protruding portions PT1, PT2, and PT3, and the central angle θ.

For example, one of each of the first protruding portions PT1, the second protruding portions PT2, and the plurality of third protruding portions PT3 may be arranged in a straight or substantially straight line with respect to a virtual line passing through the center CT of the first area A1. As another example, one of each of the first protruding portions PT1, the second protruding portions PT2, and the plurality of third protruding portions PT3 may not be arranged in a straight line.

Referring to FIG. 19B, in an embodiment, each of an outer edge and an inner edge of at least one of the plurality of shielding portions 450 may include a plurality of protruding portions PT. For example, the outer edge 452E1 of the second shielding portion 452 may include a plurality of $(2\text{-}1)^{st}$ protruding portions PT2-1, and an inner edge 452E2 of the second shielding portion 452 may include a plurality of $(2\text{-}2)^{nd}$ protruding portions PT2-2.

FIG. 19B shows that only the second shielding portion 452 of the plurality of shielding portions 450 has the protruding portions PT as an example, but the present disclosure is not limited thereto, and the outer edge and an inner edge of the first shielding portion 451 and/or the third shielding portion 453 may also include the protruding portions PT.

For example, as shown in FIG. 19B, one of each of the $(2\text{-}1)^{st}$ protruding portions PT2-1 and the $(2\text{-}2)^{nd}$ protruding portions PT2-2 may be arranged in a straight or substantially straight line with respect to the virtual line passing through the center CT of the first area A1. As another example, the $(2\text{-}1)^{st}$ protruding portions PT2-1 and the $(2\text{-}2)^{nd}$ protruding portions PT2-2 may not be arranged in a straight line with respect to the virtual line passing through the center CT of the first area A1, but may be arranged alternately.

Referring to FIG. 19C, the plurality of protruding portions PT may be arranged at irregular intervals along an edge of a corresponding shielding portion 450. Two central angles that are adjacent to each other from among the plurality of protruding portions PT may be different from each other, and there may be no regularity between the central angles thereof. For example, a first central angle θ1 formed by any two adjacent ones of the first protruding portions PT1 may be different from a second central angle θ2 formed by another two adjacent ones of the plurality of protruding portions PT1. In addition, a third central angle θ3 formed by yet another two adjacent ones of the first protruding portions PT1 may be different from the first central angle θ1 and the second central angle θ2. There may be no regularity between the first to third central angles θ1, θ2, and θ3. Similarly, the plurality of second protruding portions PT2 arranged along the outer edge 452E1 of the second shielding portion 452 and the plurality of third protruding portions PT3 arranged along the outer edge 453E1 of the third shielding portion 453 may also be arranged at irregular intervals.

As a comparative example, when the plurality of protruding portions PT are arranged in a regular pattern, the pattern of the protruding portions PT may be visually recognized by the user. According to an embodiment, the plurality of protruding portions PT may be arranged at irregular intervals, and thus, the visibility of the pattern of the protruding portions PT to the user may be reduced or minimized. Although the display apparatus according to various embodiments of the present disclosure have been mainly described above, the present disclosure is not limited thereto. For example, it may be understood that methods of manufacturing such a display apparatus also falls within the scope of the present disclosure.

According to one or more embodiments of the present disclosure as described above, the visibility of the lines of the display apparatus to the user may be reduced or minimized, and adverse effects on the components by reflecting light emitted from the light-emitting element inside the display apparatus may be reduced. However, the scope of the present disclosure is not limited by such aspects and features.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:
1. A display apparatus comprising:
a substrate comprising a first area, a second area surrounding the first area and spaced apart from the first area, and a third area between the first area and the second area;
a plurality of pixel circuits on the substrate at the second area, each of the plurality of pixel circuits comprising one or more thin-film transistors, and a storage capacitor;

a plurality of lines on the substrate at the third area, and electrically connected to the pixel circuits, respectively;

an encapsulation member covering the pixel circuits;

an input sensing section on the encapsulation member to overlap with the second area, and comprising sensing electrodes, and trace lines electrically connected to the sensing electrodes;

a plurality of shielding portions on the encapsulation member to overlap with at least one of the plurality of lines, the plurality of shielding portions being spaced apart from each other; and a plurality of metal wires on the encapsulation member to surround the plurality of shielding portions.

2. The display apparatus of claim 1, wherein the plurality of shielding portions and the plurality of metal wires contact an upper surface of the encapsulation member.

3. The display apparatus of claim 1, wherein each of the plurality of metal wires comprises a conductive material.

4. The display apparatus of claim 3, wherein each of the plurality of metal wires comprises molybdenum (Mo), mendelevium (Mb), silver (Ag), titanium (Ti), copper (Cu), aluminum (Al), or an alloy thereof.

5. The display apparatus of claim 3, wherein the plurality of metal wires comprise the same material as that of the plurality of shielding portions.

6. The display apparatus of claim 3, wherein the plurality of metal wires comprises the same material as that of the trace lines of the input sensing section.

7. The display apparatus of claim 1, wherein at least one of the plurality of metal wires is electrically connected to one of the sensing electrodes of the input sensing section.

8. The display apparatus of claim 7, wherein the plurality of metal wires comprises a first metal wire located outside of the plurality of shielding portions in a plan view and a second metal wire between the plurality of shielding portions and the first metal wire in a plan view, wherein the second metal wire is electrically isolated.

9. The display apparatus of claim 8, wherein the plurality of metal wires further comprises a third metal wire between the plurality of shielding portions and the second metal wire in a plan view, wherein the third metal wire is electrically isolated.

10. The display apparatus of claim 1, further comprising:

a first conductive layer comprising the plurality of metal wires and at least some of the trace lines of the input sensing section;

a second conductive layer comprising the sensing electrodes of the input sensing section; and an insulating layer between the first conductive layer and the second conductive layer.

11. The display apparatus of claim 10, wherein the first conductive layer comprises the plurality of shielding portions.

12. The display apparatus of claim 10, wherein the insulating layer extends from the second area to the third area, and has a hole corresponding to the first area.

13. The display apparatus of claim 10, wherein at least one of the plurality of metal wires is electrically connected to one of the sensing electrodes of the input sensing section via a contact hole located in the insulating layer.

14. The display apparatus of claim 13, wherein the one of the sensing electrodes of the input sensing section comprises a protruding portion that overlaps with a portion of the at least one of the plurality of metal wires.

15. The display apparatus of claim 14, wherein the contact hole is located in an area where the portion of the at least one of the plurality of metal wires and the protruding portion of the one of the sensing electrodes overlap with each other.

16. The display apparatus of claim 10, wherein a portion of the insulating layer is between two adjacent metal wires from among the plurality of metal wires.

17. The display apparatus of claim 1, wherein each of the plurality of metal wires surrounds the first area, and is located along an outer direction away from the first area.

18. The display apparatus of claim 17, wherein each of the plurality of metal wires has a closed curve shape.

* * * * *